(12) United States Patent
Li et al.

(10) Patent No.: US 11,114,508 B2
(45) Date of Patent: Sep. 7, 2021

(54) DISPLAY PANEL INCLUDING IMAGE POINTS ARRANGED IN RECTANGULAR GRID AND DISPLAY DEVICE

(71) Applicant: Shanghai Tianma Micro-Electronics Co., Ltd., Shanghai (CN)

(72) Inventors: Jialing Li, Shanghai (CN); Sitao Huo, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 72 days.

(21) Appl. No.: 16/675,143

(22) Filed: Nov. 5, 2019

(65) Prior Publication Data
US 2020/0075690 A1    Mar. 5, 2020

(30) Foreign Application Priority Data
May 31, 2019 (CN) .......................... 201910470813.X

(51) Int. Cl.
*H01L 27/32* (2006.01)

(52) U.S. Cl.
CPC ... *H01L 27/3218* (2013.01); *G09G 2300/0443* (2013.01); *H01L 27/3246* (2013.01)

(58) Field of Classification Search
CPC ............. H01L 27/3218; H01L 27/3246; H01L 27/3213; H01L 27/3276; H01L 27/3258; H01L 51/5234; H01L 27/3211; G09G 2300/0443; G09G 2300/0465; G09G 3/3208; H04N 5/347

USPC .......................................... 257/89; 438/22, 28
See application file for complete search history.

(56) References Cited

U.S. PATENT DOCUMENTS

| | | | |
|---|---|---|---|
| 2006/0290870 A1* | 12/2006 | Kwak | H01L 27/3218 349/144 |
| 2013/0234917 A1* | 9/2013 | Lee | H01L 27/3218 345/82 |
| 2015/0189198 A1* | 7/2015 | Park | H04N 5/347 348/302 |
| 2016/0284766 A1* | 9/2016 | Wang | H01L 27/3211 |
| 2016/0358985 A1* | 12/2016 | Bai | G09G 3/3208 |
| 2018/0294324 A1* | 10/2018 | Madigan | H01L 51/5234 |
| 2018/0350888 A1* | 12/2018 | Huo | H01L 27/3258 |
| 2019/0131589 A1* | 5/2019 | Matsueda | H01L 27/3276 |
| 2020/0212124 A1* | 7/2020 | Shao | H01L 27/3246 |

FOREIGN PATENT DOCUMENTS

CN          107742637 A          2/2018

* cited by examiner

*Primary Examiner* — Didarul A Mazumder
(74) *Attorney, Agent, or Firm* — Alston & Bird LLP

(57) ABSTRACT

A display panel and a display device are described. The display panel includes three-pixel units representing three different colors. In each pixel unit there are six sub-pixels dividing an anode formed on the pixel unit; in the same pixel unit, anodes of all sub-pixels are insulated from each other; three closest sub-pixels of different colors form a main pixel; and a center point of the main pixel is in one-to-one association with an image point of a display source image, and the image point falls within 10% proximity of the associated center point of the main pixel. The six sub-pixels in each pixel unit are formed simultaneously in a manner of pixel printing.

17 Claims, 12 Drawing Sheets

DISPLAY PANEL INCLUDING IMAGE POINTS ARRANGED IN RECTANGULAR GRID AND DISPLAY DEVICE

CROSS-REFERENCES TO RELATED APPLICATIONS

This application claims the priority to a Chinese patent application No. CN201910470813.x filed at the CNIPA on May 31, 2019, disclosure of which is incorporated herein by reference in its entirety.

TECHNICAL FIELD

Embodiments of the present disclosure relate to the field of display technologies and, in particular, to a display panel and a display device.

BACKGROUND

At present time, display technologies have come into many aspects of people's daily lives. More materials and technologies have been applied to make display screens. Nowadays, mainstream display screens mostly include liquid crystal display screens and organic light-emitting diode (OLED) display screens. An OLED display screen has the self-light-emission property, saving the energy consuming the backlight module compared with a liquid crystal display screen, therefore has the advantage of being more energy-efficient. In addition, the OLED display screen also has the characteristics of being flexible and bendable. So today OLED display has become the research focus in the display field.

In order to further enhance the quality of a display picture, an increase in the resolution and a reduction in the pixel size in the organic light-emitting display technology have become a focus of the current technology development. However, the resolution of a display screen cannot be further improved due to the limitation of a mask evaporation process during a display screen manufacturing procedure.

SUMMARY

In a first aspect, an embodiment of the present disclosure provides a display panel. The display panel includes first pixel units, second pixel units and third pixel units, disposed close to each other, representing a first, a second, and a third colors respectively. The first pixel units each comprises six first sub-pixels dividing an anode on said first pixel unit, the second pixel units each comprises six second sub-pixels dividing an anode on said second pixel unit and the third pixel units each comprises six third sub-pixels dividing an anode on said third pixel unit. In addition, all sub-pixels are insulated from each other, and a main pixel includes one of the first, one of the second, and one of the third sub-pixels.

A display source image includes a plurality of image points, arranged in a rectangular grid, where four of the plurality of image points form a smallest square in the grid. One of the plurality of image points is in one-to-one association with a center point of the main pixel, and said image point falls within 10% proximity of the associated center point of the main pixel, wherein the proximity is defined as: $L1/L2 \leq 10\%$, where L1 is a distance between said image point and the center of the main pixel, and L2 is a distance between display positions of two closest image points.

In a second aspect, an embodiment of the present disclosure further provides a display device including a display panel described in the first aspect, the display panel includes first pixel units, second pixel units and third pixel units, disposed close to each other, representing a first, a second, and a third colors respectively. The first pixel units each comprises six first sub-pixels dividing an anode on said first pixel unit, the second pixel units each comprises six second sub-pixels dividing an anode on said second pixel unit and the third pixel units each comprises six third sub-pixels dividing an anode on said third pixel unit. In addition, all sub-pixels are insulated from each other, and a main pixel includes one of the first, one of the second, and one of the third sub-pixels.

A display source image includes a plurality of image points, arranged in a rectangular grid, where four of the plurality of image points form a smallest square in the grid. One of the plurality of image points is in one-to-one association with a center point of the main pixel, and said image point falls within 10% proximity of the associated center point of the main pixel, wherein the proximity is defined as: $L1/L2 \leq 10\%$, where L1 is a distance between said image point and the center of the main pixel, and L2 is a distance between display positions of two closest image points.

BRIEF DESCRIPTION OF DRAWINGS

Features, objects and advantages of the present disclosure will become more apparent from a detailed description of non-restrictive embodiments with reference to the drawings.

DETAILED DESCRIPTION

In order to make the objects, technical solutions and advantages of the present disclosure clearer, the technical solutions of the present disclosure will be described below in detail in conjunction with the drawings in the embodiments of the present disclosure and the specific embodiments. The described embodiments are part, not all, of the embodiments of the present disclosure, and based on the embodiments of the present disclosure, other embodiments acquired by those skilled in the art on the premise that no creative work is done are within the scope of the present disclosure.

Figure 1:
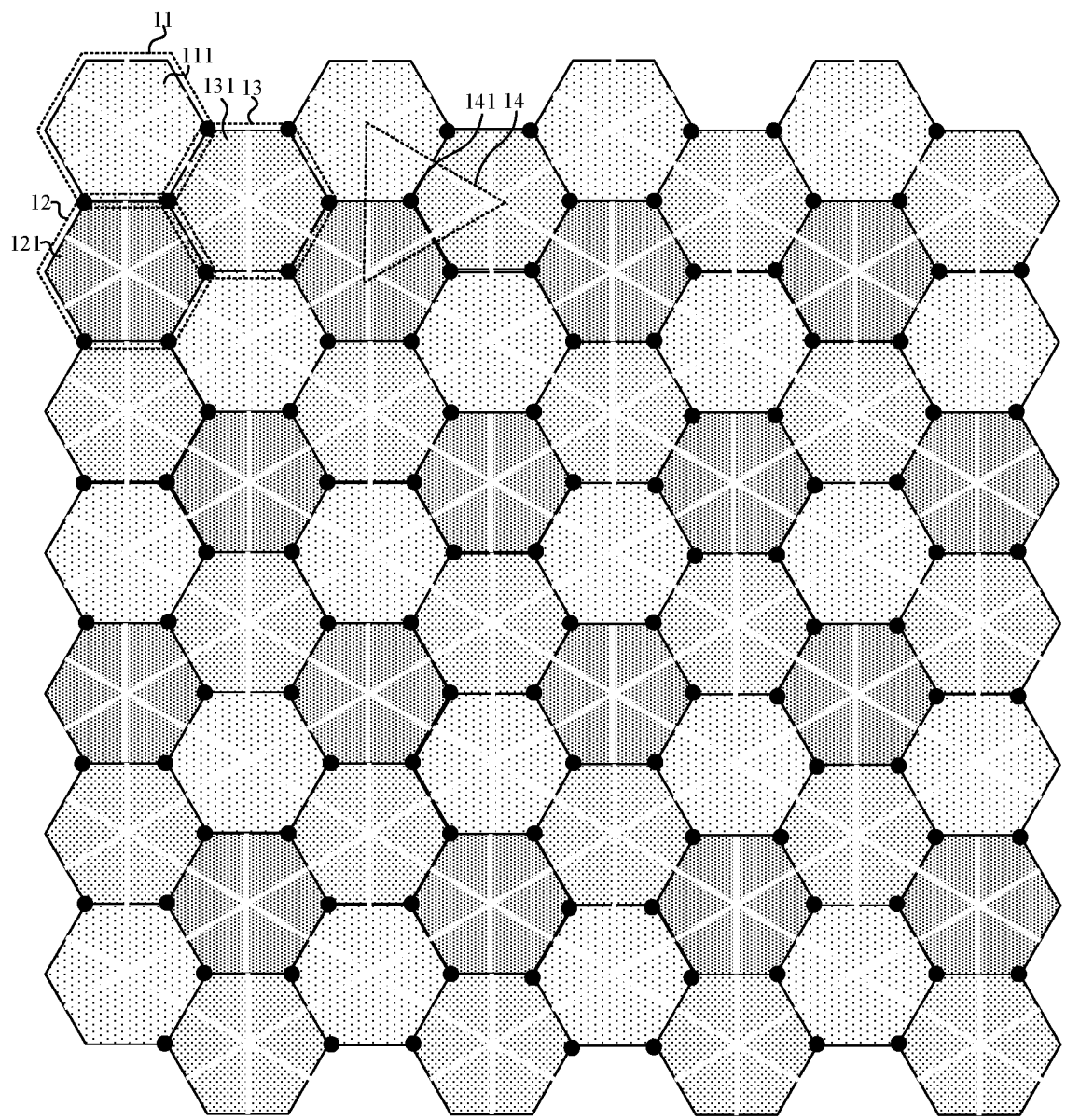
FIG. 1 is a structural diagram of a display panel according to an embodiment of the present disclosure.

FIG. 1 is a structural diagram of a display panel according to an embodiment of the present disclosure. As shown in FIG. 1, the display panel provided in the embodiment of the present disclosure includes a first pixel unit 11, a second pixel unit 12 and a third pixel unit 13. The first pixel unit, the second pixel unit and the third pixel unit emit different colors, the first pixel unit 11 includes six first sub-pixels 111 divided in an anode, the second pixel unit 12 includes six second sub-pixels 121 divided in an anode, and the third pixel unit 13 includes six third sub-pixels 131 divided in an anode. Anodes of all sub-pixels in the same pixel unit are insulated from each other. Three adjacent sub-pixels of different colors form a main pixel 14. Organic light-emitting layers in sub-pixels of the first pixel unit 11, the second pixel unit 12 and the third pixel unit 13 are formed simultaneously in a manner of pixel printing. The manner of pixel printing is different from a solution of forming the organic light-emitting layers by using an evaporation process in the related art. When the organic light-emitting layers of the six sub-pixels are acquired through simultaneous printing in the manner of pixel printing, the precision of a mask plate in the existing mask evaporation procedure and the alignment precision between different film layers of the mask evaporation are not required to be considered, the pixel resolution of the display panel can be ensured to be very high, and a development trend of refined display of the existing display panel is met.

Figure 2:
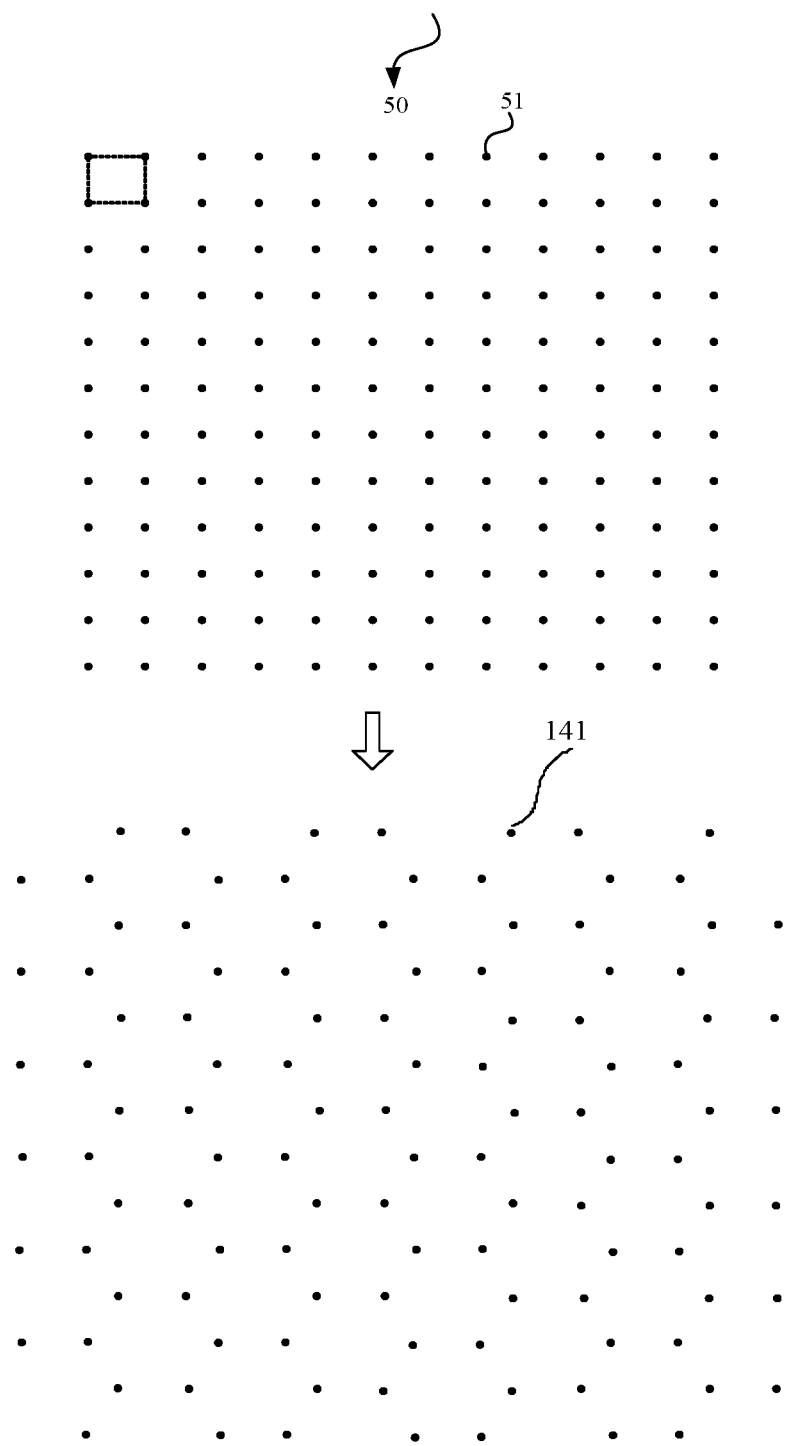
FIG. 2 is a schematic diagram illustrating a display image including an array of points in a display source image according to an embodiment of the present disclosure.

FIG. 2 is a schematic diagram illustrating a display procedure of image points in a display source image according to an embodiment of the present disclosure. As shown in FIG. 2, a display source image 50 when an existing display panel is used for displaying includes a plurality of image points 51 arranged in a matrix, each image point 51 includes red, green, and blue (RGB) color information about an image pixel of a to-be-displayed image, four adjacent image points 51 are arranged in a square, and a central point 141 of a main pixel is in one-to-one correspondence with an image point 51 during a display process of the display panel. Four adjacent image points 51 are arranged in a square and four adjacent center points 141 of main pixels are not arranged in a square, so when the display panel shown in FIG. 1 is used to display the display source image 50, the image points 51 of the display source image 50 need to be processed through formula calculation, as shown in FIG. 2, so as to ensure matching with the center points 141 of main pixels in the display panel. When the image points 51 of the display source image 50 is processed through calculation, on one hand, the calculation needs to be accurate, and on the other hand, when the image points 51 are processed and then matched with the center points 141 of main pixels, display distortion is easily caused, and the display effect of the display panel is affected.

Based on the above technical problem, the inventor of the present disclosure further develops a technical solution described below. A display panel includes a first pixel unit, a second pixel unit and a third pixel unit, and the first pixel unit, the second pixel unit and the third pixel unit have different colors. The first pixel unit includes six first sub-pixels divided according to an anode, the second pixel unit includes six second sub-pixels divided according to an anode, and the third pixel unit includes six third sub-pixels divided according to an anode. Anodes of all sub-pixels in the same pixel unit are insulated from each other. Three adjacent sub-pixels of different colors form a main pixel. The display panel also includes a display source image. Image points of the display source image are arranged in a rectangular array, and adjacent four of the image points are arranged in a square. A center point of the main pixel is in one-to-one correspondence with an image point, and for a distance L1 between the center point of the main pixel and a corresponding image point in a first direction and a distance L2 between display positions of adjacent two of the image points, $L1/L2 \leq 10\%$. The first direction is any direction in a plane where the display panel is located. By using the above technical solution, on one hand, organic light-emitting layers in sub-pixels of the first pixel unit, the second pixel unit and the third pixel unit are formed simultaneously in a manner of pixel printing. The manner of pixel printing is different from a solution of forming the organic light-emitting layers by using an evaporation procedure in the related art in that the precision of a mask plate in the existing mask evaporation procedure and the alignment precision between different film layers of the mask evaporation are not required to be considered. The pixel resolution of the display panel is ensured to be high, and a development trend of refined display of the existing display panel is met. Meanwhile, the central point of the main pixel is in one-to-one correspondence with the image point of the display source image, the distance L1 between the center point of the main pixel and a corresponding image point in any direction in a plane where the display panel is located and the distance L2 between display positions of two adjacent image points satisfy that $L1/L2 \leq 10\%$, and the matching degree of the central point of the main pixel and the image point of the display source image is ensured to be high. The image point of the display source image may be displayed directly through the display panel provided in the embodiment of the present disclosure, and does not need to be calculated or deformed according to the calculation result to match the central point of the main pixel. The display procedure is simple, and the display response is fast. Meanwhile, the image point of the display source image does not need to be deformed, so that high display fidelity and good display effect are ensured.

The embodiments of the present disclosure will be described clearly in conjunction with drawings. Based on the embodiments of the present disclosure, all other embodiments acquired by those skilled in the art without making creative work are within the scope of the embodiments of the present disclosure.

Figure 3:
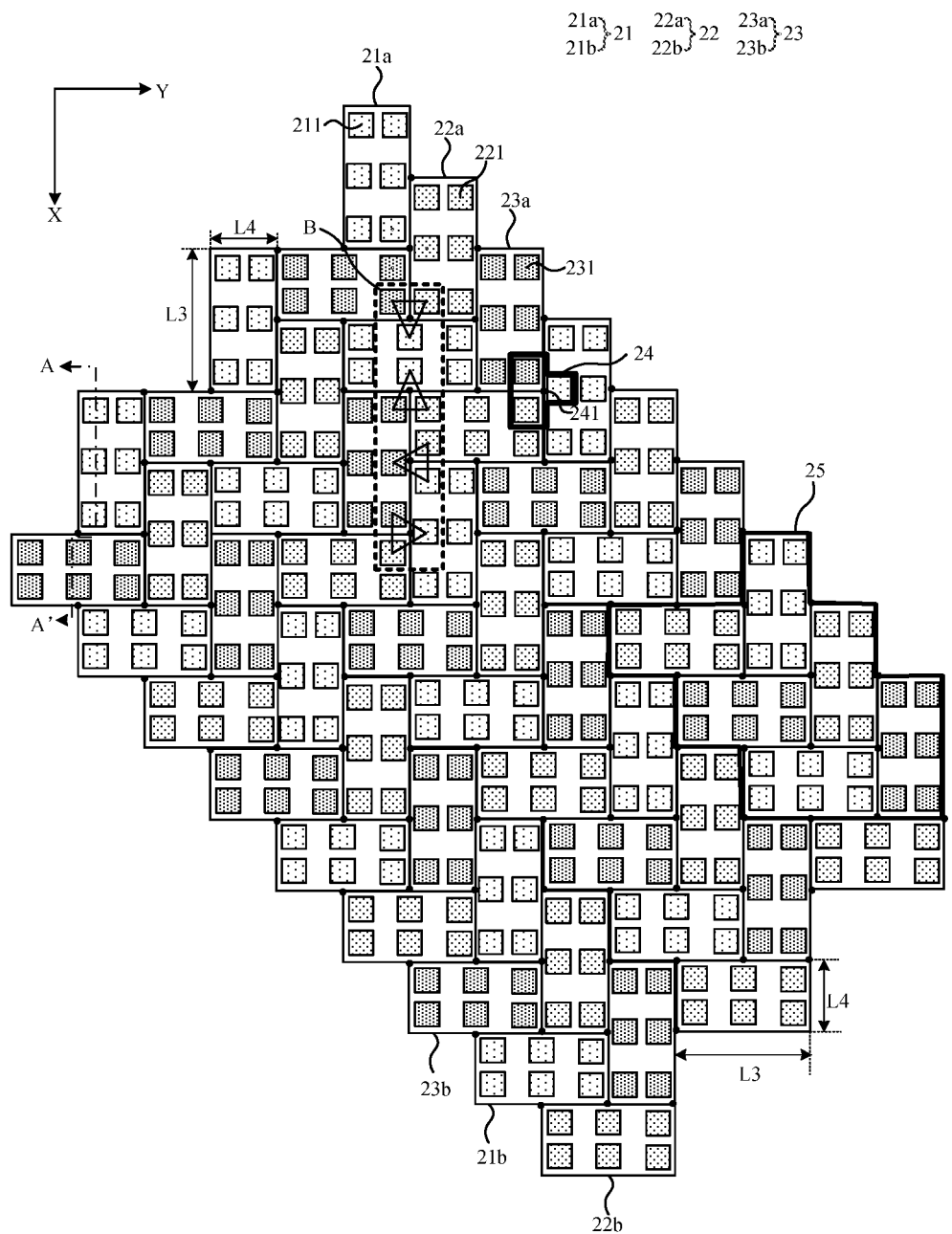
FIG. 3 is a structural diagram of another display panel according to an embodiment of the present disclosure.
Figure 4:
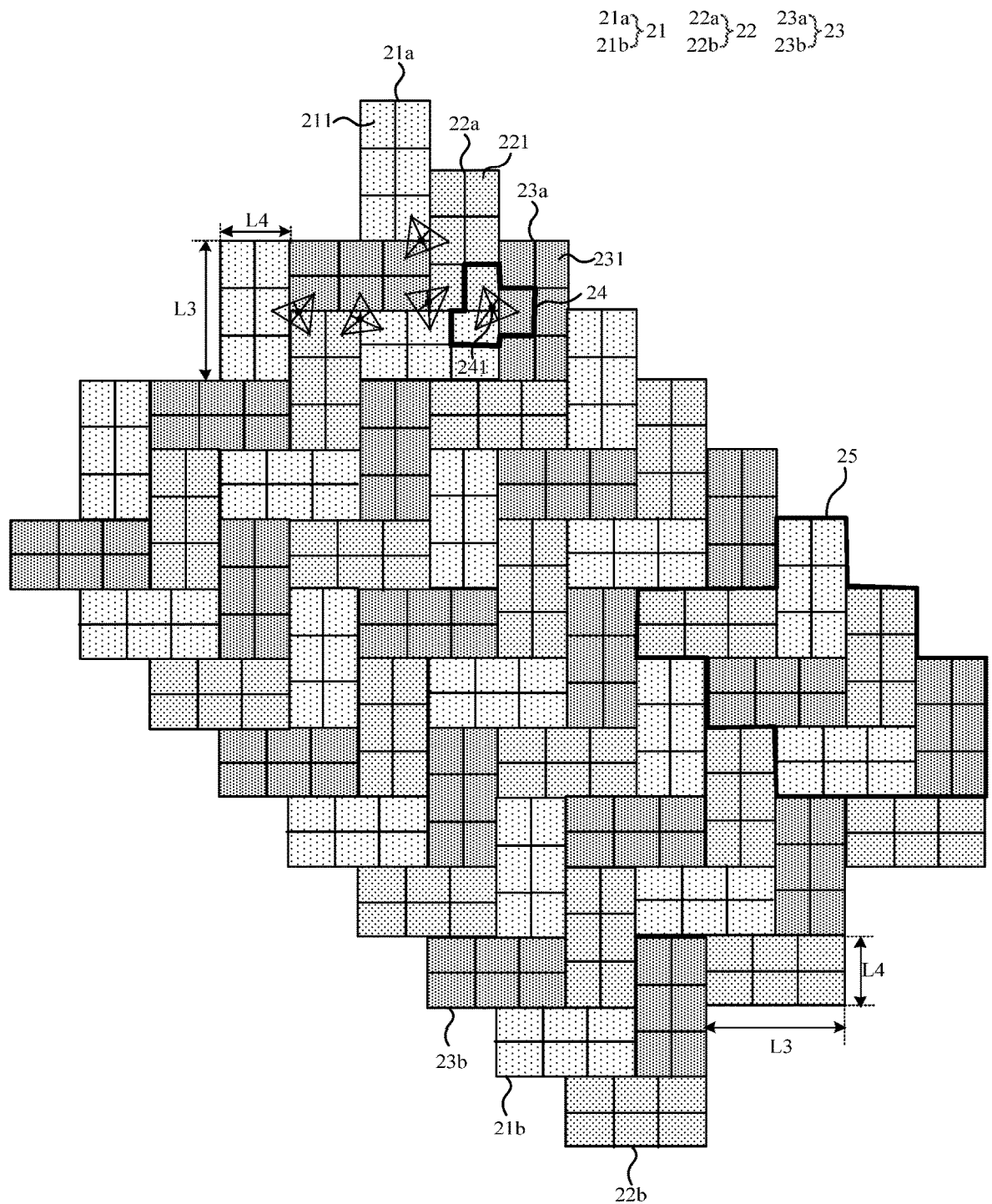
FIG. 4 is a structural diagram of another display panel according to an embodiment of the present disclosure.
Figure 5:
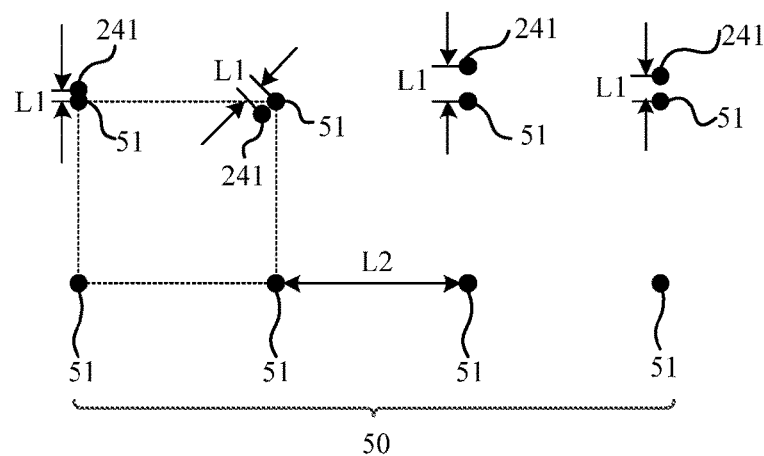
FIG. 5 is a schematic diagram illustrating correspondence between an image point of a display source image and a center point of a main pixel, according to an embodiment of the present disclosure.

FIG. 3 is a structural diagram of another display panel according to an embodiment of the present disclosure. FIG. 4 is a structural diagram of another display panel according to an embodiment of the present disclosure. FIG. 5 is a schematic diagram illustrating correspondence between an image point of a display source image and a center point of a main pixel according to an embodiment of the present disclosure. As shown in FIG. 3, FIG. 4 and FIG. 5, the display panel provided in the embodiments of the present disclosure includes a first pixel unit 21, a second pixel unit 22 and a third pixel unit 23, and the first pixel unit 21, the second pixel unit 22 and the third pixel unit 23 have different colors. The first pixel unit 21 includes six first sub-pixels 211 divided according to an anode, the second pixel unit 22 includes six second sub-pixels 221 divided according to an anode, and the third pixel unit 23 includes six third sub-pixels divided 231 according to an anode. Anodes of all sub-pixels in the same pixel unit are insulated from each other. Three adjacent sub-pixels of different colors form a main pixel 24. The display panel also includes a display source image 50, where image points 51 of the display source image are arranged in a rectangular array, and adjacent four of the image points 51 are arranged in a square. A center point 241 of the main pixel is in one-to-one correspondence with an image points 51, and for a distance L1 between the center point 241 of the main pixel and a corresponding image point 51 in a first direction and a distance L2 between display positions of adjacent two image points 51, L1/L2≤10%. The first direction is any direction in a plane where the display panel is located.

As shown in FIG. 3 and FIG. 4, the display panel includes the first pixel unit 21, the second pixel unit 22 and the third pixel unit 23, and the first pixel unit 21, the second pixel unit 22 and the third pixel unit 23 have different colors. Each of the first pixel unit 21, the second pixel unit 22 and the third pixel unit 23 includes six sub-pixels divided according to an anode, and each of the sub-pixels includes an anode, an organic light emitting layer and a cathode (not shown in the figure). Anodes of six sub-pixels in the same pixel unit 21 are insulated from each other, and the anode of each sub-pixel may receive different anode signals to drive the organic light-emitting layer to perform light-emitting display. Organic light-emitting layers of the six sub-pixels are formed simultaneously in the manner of pixel printing. The manner of pixel printing is different from a solution of forming the organic light-emitting layers by using an evaporation process in the related art. When the organic light-emitting layers of the six sub-pixels are acquired through simultaneous printing in the manner of pixel printing, the precision of a mask plate in the existing mask evaporation procedure and the alignment precision between different film layers of the mask evaporation are not required to be considered, the pixel resolution of the display panel can be ensured to be very high, and a development trend of refined display of the existing display panel is met.

With continued reference to FIG. 3, FIG. 4 and FIG. 5, in the display panel provided in the embodiment of the present disclosure, three adjacent sub-pixels having different colors form the main pixel 24, and the central point 241 of the main pixel is in one-to-one correspondence with the image point 51 of the display source image 50 to be displayed in the display panel, so as to ensure that the main pixel 24 for displaying each image point 51 exists in the display panel. Meanwhile, the distance L1 between the center point 241 of the main pixel and the corresponding image point 51 in the first direction and the distance L2 between the display positions of two adjacent image points 51 satisfy that L1/L2≤10%. For example, in the display panel shown in FIG. 3, the distance L1 between the center point 241 of the main pixel and the corresponding image point 51 in the first direction is 0, and L1/L2=0. In the display panel shown in FIG. 4, the distance L1 between the center point 241 of the main pixel and the corresponding image point 51 in the first direction and the distance L2 between the display positions of two adjacent image points 51 satisfy that L1/L2≤10%. As shown in FIG. 5, to ensure that the center point 241 of the main pixel is completely or highly matched with the image point 51 of the display source image 50, the image point 51 of the display source image 50 may be displayed directly through the display panel provided in the embodiment of the present disclosure, and does not need to be calculated or deformed according to the calculation result to match the central point 241 of the main pixel. The display procedure is simple, and the display response is fast. Meanwhile, the image point 51 of the display source image 50 does not need to be deformed, so that high display fidelity and good display effect are ensured.

It may be understood that the first direction in the embodiments of the present disclosure may be any direction in the plane where the display panel is located. For example, as shown in FIG. 5, the first direction may be understood as a direction parallel to a line connecting the center point 241 of the main pixel and the image point 51 of the display source image 50.

It is to be noted that the display source image 50 is image information that needs to be displayed in the display panel, is a virtual object, and is not an element actually included in the display panel. The embodiments of the present disclosure exemplarily show the display source image 50 and a plurality of image points 51 included in the display source image 50 to illustrate the correspondence between the image point 51 in the display source image 50 and the center point 141 of the main pixel.

In one embodiment of the present disclosure, as shown in FIG. 3 and FIG. 4, the display panel provided in the embodiment of the present disclosure includes a plurality of repeating units 25. One repeating unit 25 includes two first pixel units 21, two second pixel units 22 and two third pixel units 23. The two first pixel units 21 include a first A-type pixel unit 21a and a first B-type pixel unit 21b whose long-axis directions are perpendicular to each other. The two second pixel units 22 include a second A-type pixel unit 22a and a second B-type pixel unit 22b whose long-axis directions are perpendicular to each other. The two third pixel units 23 include a third A-type pixel unit 23a and a third B-type pixel unit 23b whose long-axis directions are perpendicular to each other. Long-axis directions of the first A-type pixel unit 21a, the second A-type pixel unit 22a and the third A-type pixel unit 23a are the same and are the first long-axis direction (X-direction as shown in the figure). Long-axis directions of the first B-type pixel unit 21b, the second B-type pixel unit 22b and the third B-type pixel unit 23b are the same and are the second long-axis direction (Y-direction as shown in the figure). Along the second long-axis direction, the first A-type pixel unit 21a, the second A-type pixel unit 22a and the third A-type pixel unit 23a are adjacently disposed in sequence and are staggered in sequence by a preset distance along the first long-axis direction. Along the first long-axis direction, the first B-type pixel unit 21b, the second B-type pixel unit 22b and the third B-type pixel unit 23b are adjacently disposed in sequence, and are staggered in sequence by the preset distance along the second long-axis direction. The first A-type pixel unit 21a is disposed adjacent to the second B-type pixel unit 22b and the third B-type pixel unit 23b which are located in the same repeating unit 25 as the first A-type pixel unit 21a. The second A-type pixel unit 22a is disposed adjacent to the first B-type pixel unit 21b and the third B-type pixel unit 23b which are located in the same repeating unit 25 as the second A-type pixel unit 22a. The third A-type pixel unit 23a is disposed adjacent to the first B-type pixel unit 21b located in the same repeating unit 25 as the third A-type pixel unit 23a and the second B-type pixel unit 22b located in the adjacent repeating unit 25.

Exemplarily, the display panel is configured to include a plurality of repeating units 25 arranged in sequence along the first or second long-axis direction to cover the entire display panel. Each repeating unit is configured to include the first A-type pixel unit and the first B-type pixel unit perpendicular to each other in the long-axis direction, the second A-type pixel unit and the second B-type pixel unit perpendicular to each other in the long-axis direction, and the third A-type pixel unit and the third B-type pixel unit perpendicular to each other in the long-axis direction. Meanwhile, the relative position relationship between pixel units in the repeating unit is configured. Thus, the central point of the main pixel can be ensured to be highly matched with a display position of the corresponding image point. The image point of the display source image 50 is displayed directly through the display panel provided in the embodiment of the present disclosure, and does not need to be calculated or deformed according to the calculation result to match the central point of the main pixel. The display procedure is simple, and the display response is fast. Meanwhile, the image point of the display source image does not need to be calculated to match the central point of the main pixel, so that high display fidelity and good display effect are ensured.

Further, still referring to FIG. 3 and FIG. 4, the first A-type pixel unit 21*a*, the second A-type pixel unit 22*a* and the third A-type pixel unit 23*a* each have a maximum length L3 in the first long-axis direction and a maximum length L4 in the second long-axis direction; and the first B-type pixel unit 21*b*, the second B-type pixel unit 22*b* and the third B-type pixel unit 23*b* each have a maximum length L4 in the first long-axis direction and a maximum length L3 in the second long-axis direction. L3=2·L4. A preset distance by which the first A-type pixel unit 21*a*, the second A-type pixel unit 22*a* and the third A-type pixel unit 23*a* are staggered in sequence along the first long-axis direction has a length of L4; and a preset distance by which the first B-type pixel unit 21*b*, the second B-type pixel unit 22*b* and the third B-type pixel unit 23*b* are staggered in sequence along the second long-axis direction has a length of L4.

Exemplarily, while the relative position relationship between pixel units in the repeating unit is set, the extension lengths of each pixel unit in the first long-axis direction and the second long-axis direction respectively, the preset distance by which the first A-type pixel unit 21*a*, the second A-type pixel unit 22*a* and the third A-type pixel unit 23*a* are staggered in sequence in the first long-axis direction and the preset distance by which the first B-type pixel unit 21*b*, the second B-type pixel unit 22*b* and the third B-type pixel unit 23*b* are staggered in sequence in the second long-axis direction are further configured. Thus, it can be further ensured that the distance L1 between the center point of the main pixel and a corresponding image point in any direction in a plane where the display panel is located and the distance L2 between display positions of two adjacent image points satisfy that L1/L2≤10%, and that the central point of the main pixel is highly matched with the image point of the display source image. The image point of the display source image may be displayed directly through the display panel provided in the embodiment of the present disclosure, and does not need to be calculated to match the central point of the main pixel. High display fidelity and good display effect can be ensured.

Specifically, in the technical solution in which the distance L1 between the center point of the main pixel and a corresponding image point in any direction in the plane where the display panel is located and the distance L2 between display positions of two adjacent image points satisfy that L1/L2≤10%, the shape and arrangement of each sub-pixel are various, and will be described in detail below.

Firstly, the distance L1 between the center point of the main pixel and the corresponding image point in any direction in the plane where the display panel is located and the distance L2 between display positions of two adjacent image points satisfy that L1/L2≤10%, and a case in which the distance L1 between the center point of the main pixel and the corresponding image point in any direction in the plane where the display panel is located is 0 in included. In this way, the center point of the main pixel and the image point of the display source image can be completely overlapped, the display source image can be accurately displayed by directly using the display panel provided in the embodiment of the present disclosure, the display procedure is simple, and the display response is fast. Meanwhile, the 100% fidelity of the display is ensured, and the display effect is good. Next, the distance L1 between the center point of the main pixel and the corresponding image point in the first direction being 0 will be described in detail.

Figure 6:
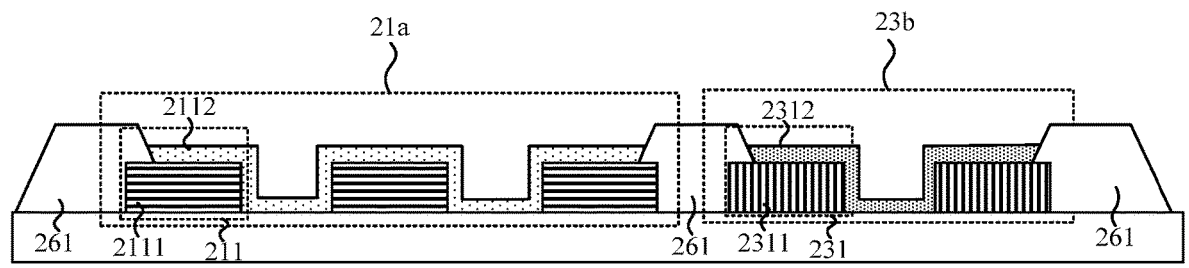
FIG. 6 is a cross sectional view of the display panel shown in FIG. 3 along a section line A-A'.

FIG. 6 is a section view of the display panel shown in FIG. 3 along a section line A-A'. FIG. 3 and FIG. 6 illustrate the case where the distance L1 between the center point of the main pixel and the corresponding image point in the first direction is 0 by taking the example that the shape of the pixel unit includes a rectangle and the shape of the sub-pixel includes a rectangle. As shown in FIG. 3 and FIG. 6, the shapes of the first pixel unit 21, the second pixel unit 22, and the third pixel unit 23 respectively include a rectangle; the shapes of the first sub-pixel 211, the second sub-pixel 221, and the third sub-pixel 231 respectively include a rectangle; and the center point 241 of the main pixel is located at a junction point position of the first pixel unit 21, second pixel unit 22 and third pixel unit 23, which are adjacent to each other.

Exemplarily, the display panel provided in the embodiment of the present disclosure further includes a first pixel defining layer for defining shapes and light-emitting regions of different pixel units; and meanwhile, shapes and light-emitting regions of different sub-pixels in the same pixel unit may be defined through the shape of the anode. Specifically as shown in FIG. 6, a first pixel defining layer 261 is disposed between the first A-type pixel unit 21*a* and the third B-type pixel unit 23*b*, and the shape of the pixel unit may be adjusted by adjusting the width of the first pixel defining layer 261. Each of the plurality of first sub-pixels 211 in the first A-type pixel unit 21*a* includes a first anode 2111 and a first organic light-emitting layer 2112, and each of the plurality of third sub-pixels 231 in the third B-type pixel unit 23*b* includes a third anode 2311 and a third organic light-emitting layer 2312. The shape and the light-emitting region of the first sub-pixel 211 may be adjusted by adjusting the size of the first anode 2111, and the shape and the size of the third sub-pixel 231 may be adjusted by adjusting the size of the third anode 2311. The width of the first pixel defining layer 261 and the size of the anode in each pixel unit may be adjusted for adjusting the center point 241 of the main pixel to be at the junction point position of the first pixel unit 21, second pixel unit 22 and third pixel unit 23, which are adjacent to each other, so as to ensure that the distance L1 between the center point of the main pixel and the corresponding image point in the direction in which the two points are connected to form a line is 0, that the center point of the main pixel is completely overlapped with the image point of the display source image, and that the display source image can be accurately displayed by directly using the display panel provided in the embodiment of the present disclosure. The display procedure is simple, and the display response is fast. Meanwhile, the 100% fidelity of the display is ensured, and the display effect is good.

Figure 7:
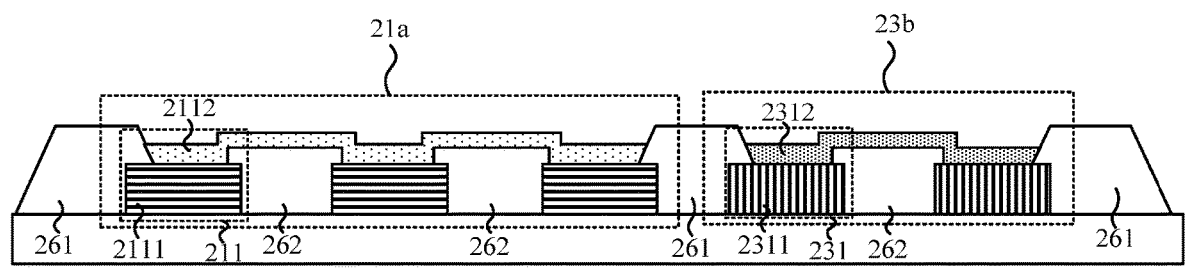
FIG. 7 is another cross sectional view of the display panel shown in FIG. 3 along the section line A-A'.

Further, FIG. 7 is another section view of the display panel shown in FIG. 3 along the section line A-A'. Based on the above embodiment, the embodiment of the present disclosure may further include a second pixel defining layer located in the same pixel unit. As shown in FIG. 7, the first A-type pixel unit 21a and the third B-type pixel unit 23b each have a second pixel defining layer 262 disposed between every two adjacent sub-pixels, and the size and the shape of each sub-pixel in the pixel unit may be adjusted by adjusting the width of the second pixel defining layer 262. Further, the widths of the first pixel defining layer 261 and the second pixel defining layer 262 may be adjusted for adjusting the center point 241 of the main pixel to be at the junction point position of the first pixel unit 21, second pixel unit 22 and third pixel unit 23, which are adjacent to each other, so as to ensure that the distance L1 between the center point of the main pixel and the corresponding image point in the direction in which the two points are connected to form a line is 0, that the center point of the main pixel is completely overlapped with the image point of the display source image, and that the display source image can be accurately displayed by directly using the display panel provided in the embodiment of the present disclosure. The display procedure is simple, and the display response is fast. Meanwhile, the 100% fidelity of the display is ensured, and the display effect is good.

In one embodiment of the present disclosure, still referring to FIG. 7, the first sub-pixel 211 may include a first anode 2111 and a first organic light-emitting layer 2112, the third sub-pixel 231 may include a third anode 2311 and a third organic light-emitting layer 2312, second pixel defining layers 262 are located respectively between two adjacent first anodes 2111 insulated from each other and between two adjacent third anodes 2311 insulated from each other, and may also serve as an insulating layer between two adjacent first anodes 2111 and an insulating layer between two adjacent third anodes 2311 respectively, so as to ensure good insulation between two adjacent first anodes 2111 and between two adjacent third anodes 2311. It may be understood that FIG. 7 only schematically illustrates that second pixel defining layers 262 may serve as an insulating layer between two adjacent first anodes 2111 and an insulating layer between two adjacent third anodes 2311 respectively, and that the second pixel defining layer 262 may also serve as an insulating layer between anodes in two adjacent second sub-pixels, which is not described herein.

It is to be noted that a gap exists between two adjacent sub-pixels in the display panel shown in FIG. 3. The gap may be regarded as a distance between anodes insulated from each other, or a position of the second pixel defining layer when the second pixel definition layer exists between two adjacent sub-pixels in the same pixel unit. In an actual display panel product, the organic light-emitting layers corresponding to the same pixel unit is printed as a whole layer. As shown in FIG. 6, the organic light-emitting layer is also disposed between two adjacent anodes, or as shown in FIG. 7, the organic light emitting layer is also disposed on the second pixel defining layer 262 between two adjacent anodes. However, no anode is disposed between two adjacent anodes or at a position corresponding to the second pixel defining layer 262, and no freely movable carriers exist, so the organic light-emitting layer between the two adjacent anodes or at the position corresponding to the second pixel defining layer 262 does not emit light, and an actual light-emitting region is a region defined by anodes.

Figure 8:
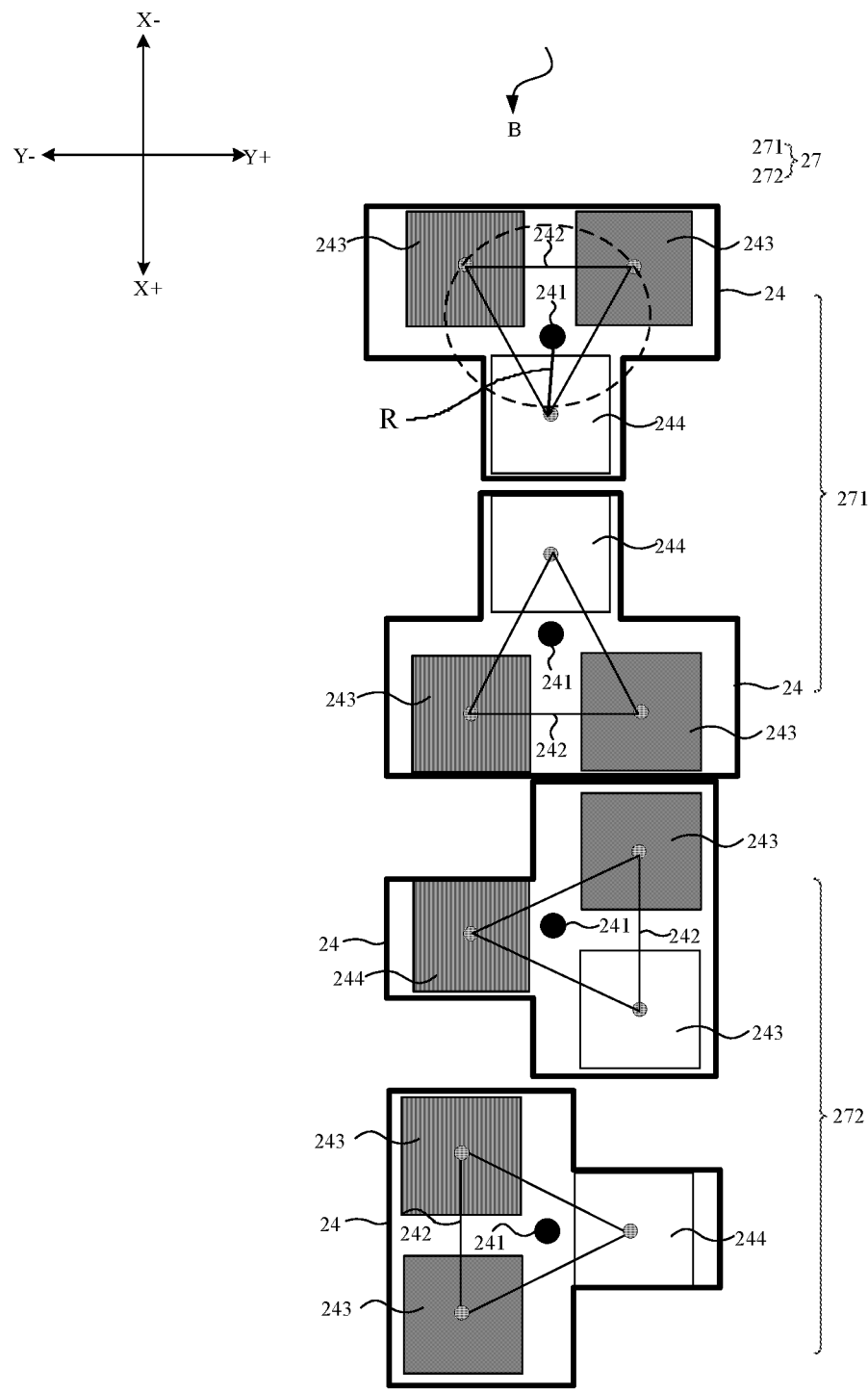
FIG. 8 is a structural diagram of the display panel shown in FIG. 3 in an area B.

FIG. 8 is an enlarged view of the display panel shown in FIG. 3 in an area B. As shown in FIG. 3 and FIG. 8, every two of center points of three sub-pixels in the same main pixel are connected into lines to form an isosceles triangle; each isosceles triangle includes a first side 242 whose extension direction is parallel to the first long-axis direction (X-direction as shown in the figure) or the second long-axis direction (Y-direction as shown in the figure), and a direction in which the center point 241 of the main pixel points to a midpoint of the first side 242 is a setting direction. Along the first long-axis direction or the second long-axis direction, adjacent four main pixels 24 form a main pixel group 27. Each main pixel group includes a first main pixel subgroup 271 and a second main pixel subgroup 272. Setting directions corresponding to two main pixels 24 in the first main pixel subgroup 271 are opposite, such as respectively an X+-direction and an X−-direction. Setting directions corresponding to two main pixels 24 in the second main pixel subgroup 272 are opposite, such as respectively a Y+-direction and a Y−-direction. A setting direction corresponding to either of the two main pixels 24 in the first main pixel subgroup 271 is perpendicular to a setting direction corresponding to either of the two main pixels 24 in the second main pixel subgroup 272.

Exemplarily, the setting directions corresponding to two main pixels 24 in the first main pixel subgroup 271 are opposite, the setting directions corresponding to two main pixels 24 in the second main pixel subgroup 272 are opposite, and the setting direction corresponding to either of the two main pixels 24 in the first main pixel subgroup 271 is perpendicular to the setting direction corresponding to either of the two main pixels 24 in the second main pixel subgroup 272. Thus, other main pixels 24 may be acquired by rotating one main pixel 24, so that the main pixels in the display panel are simply configured. Through the simple configuration of the main pixels, the center point 241 of the main pixel is completely overlapped with the image point of the display source image. It is ensured that the configuration manner of the main pixel is easy while the display effect of the display panel is good, and that the preparation process of the display panel is simple.

In one embodiment of the present disclosure, still referring to FIG. 3 and FIG. 8, two sub-pixels whose center points are connected into a line as the first side 242 are the first-type sub-pixels 243, and the sub-pixel other than the first-type sub-pixels 243 in the same main pixel 24 is the second-type sub-pixel 244; in the same main pixel 24, the areas of the two first-type sub-pixels 243 are the same; and in any two main pixels 24, the areas of the first-type sub-pixels 243 are the same, and the areas of the second-type sub-pixels 244 are the same.

Exemplarily, in the same main pixel 24, the areas of the two first-type sub-pixels 243 are the same; and in any two main pixels 24, the areas of the first-type sub-pixels 243 are the same, and the areas of the second-type sub-pixels 244 are the same, so as to ensure that every two of center points of three sub-pixels in the same main pixel are connected into lines to form an isosceles triangle, and any two main pixels may have a simple corresponding relationship, for example, one main pixel may be rotated to acquire another main pixel. The main pixels in the whole display panel are simply arranged.

Further, the area of the first sub-pixel 211, the area of the second sub-pixel 221 and the area of the third sub-pixel 231 are the same, center points of the sub-pixels are connected into lines to form an equilateral triangle, and the shapes of any two main pixels 24 are the same, so that the main pixel configuration manner is further simplified while the center point 241 of the main pixel is completely overlapped with the image point of the display source image, and the simple preparation process of the display panel is ensured.

Figure 9:
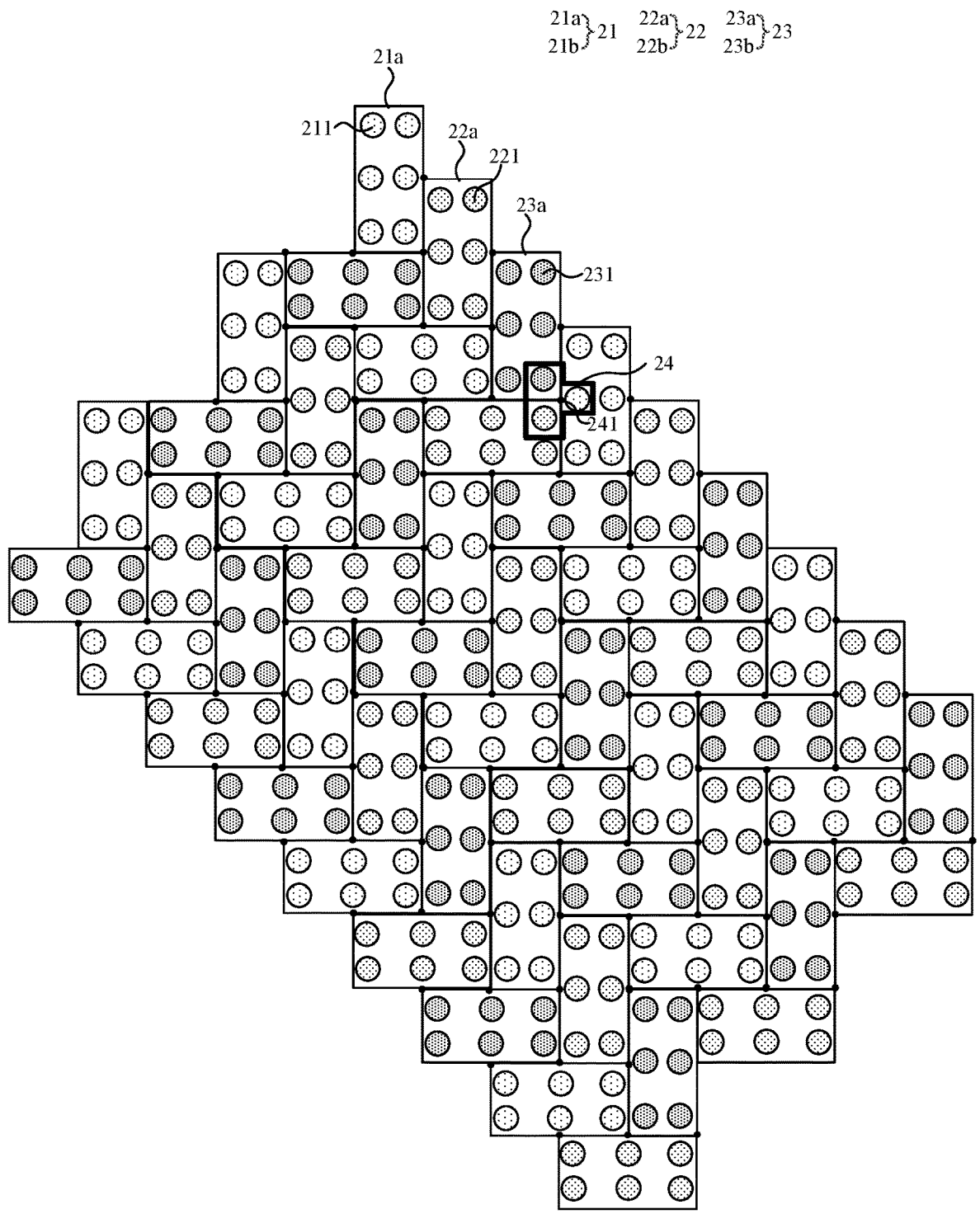
FIG. 9 is a structural diagram of another display panel according to an embodiment of the present disclosure.

FIG. 9 is a structural diagram of another display panel according to an embodiment of the present disclosure. FIG. 9 illustrates the case where the distance L1 between the center point of the main pixel and the corresponding image point in the first direction is 0 by taking the example that the shape of the pixel unit includes a rectangle and the shape of the sub-pixel includes a circle.

Exemplarily, the display panel provided in the embodiment of the present disclosure further includes a first pixel defining layer for defining shapes and light-emitting regions of different pixel units, specifically, the first pixel defining layer may be disposed between different pixel units, such as in a region between two adjacent pixel units shown in the figure, shapes and light-emitting regions of different sub-pixels are defined through the first pixel defining layer, and shapes and light-emitting regions of different sub-pixels in the same pixel unit may be adjusted through the size of an anode. The shape and the size of the first pixel defining layer 261 and the shape and the size of the anode may be adjusted for adjusting the shape of the pixel unit to be a rectangle and the shape of the sub-pixel in the pixel unit to be a circle, and meanwhile the center point 241 of the main pixel to be at the junction point position of the first pixel unit 21, second pixel unit 22 and third pixel unit 23, which are adjacent to each other, so as to ensure that the distance L1 between the center point of the main pixel and the corresponding image point in the direction in which the two points are connected to form a line is 0, that the center point of the main pixel is completely overlapped with the image point of the display source image, and that the display source image can be accurately displayed by directly using the display panel provided in the embodiment of the present disclosure. The display procedure is simple, and the display response is fast. Meanwhile, the 100% fidelity of the display is ensured, and the display effect is good. Alternatively, a second pixel defining layer may be disposed between different sub-pixels in the same pixel unit, such as in a region between two adjacent sub-pixels shown in the figure, and shapes and light-emitting regions of different sub-pixels may be defined through the second pixel defining layer. The shape and the size of the first pixel defining layer and the shape and the size of the second pixel defining layer may be adjusted for adjusting the shape of the pixel unit to be a rectangle and the shape of the sub-pixel in the pixel unit to be a circle, and meanwhile the center point 241 of the main pixel to be at the junction point position of the first pixel unit 21, second pixel unit 22 and third pixel unit 23, which are adjacent to each other, so as to ensure that the distance L1 between the center point of the main pixel and the corresponding image point in the direction in which the two points are connected to form a line is 0, that the center point of the main pixel is completely overlapped with the image point of the display source image, and that the display source image can be accurately displayed by directly using the display panel provided in the embodiment of the present disclosure. The display procedure is simple, and the display response is fast. Meanwhile, the 100% fidelity of the display is ensured, and the display effect is good.

Figure 10:
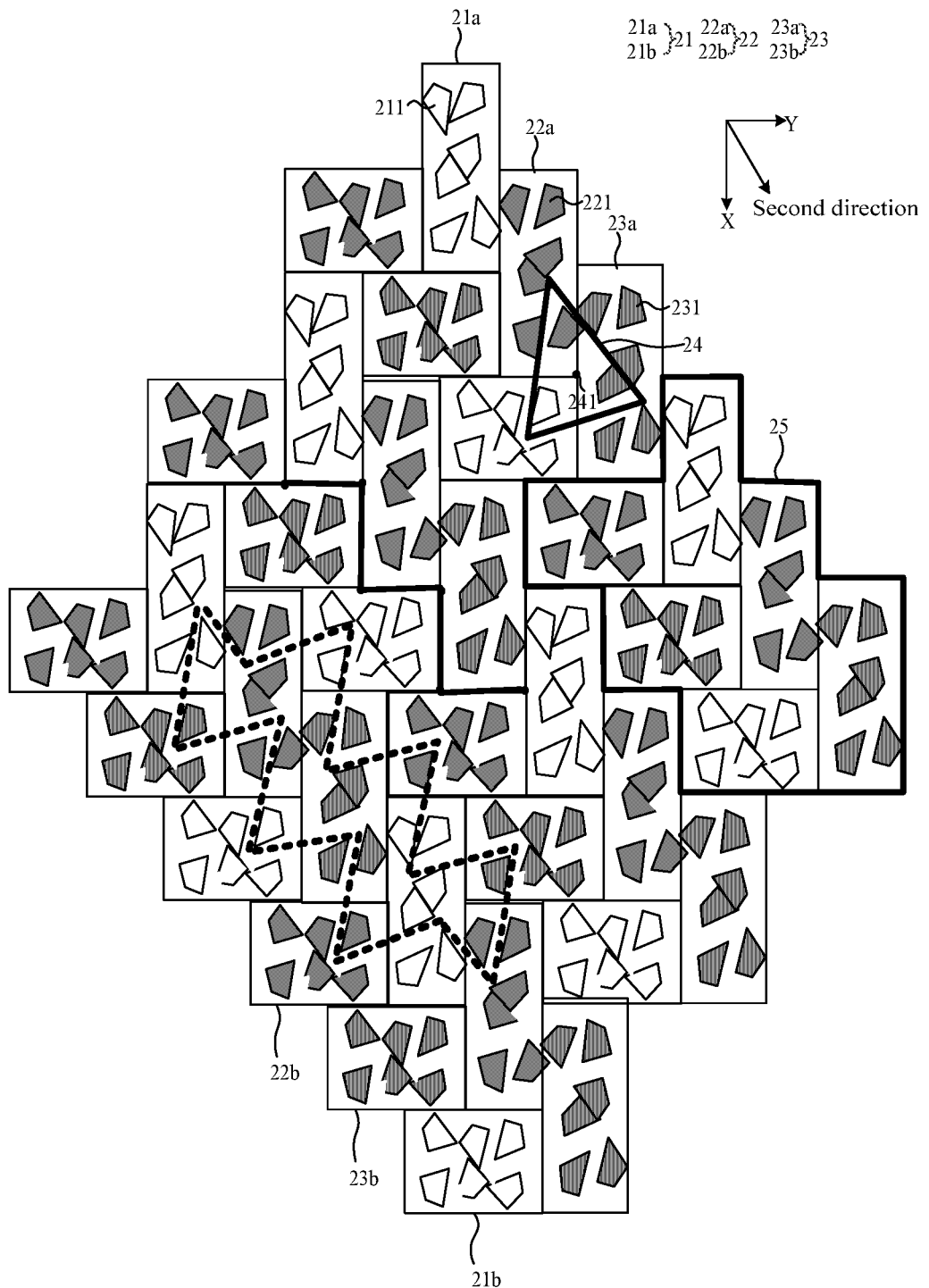
FIG. 10 is a structural diagram of another display panel according to an embodiment of the present disclosure.
Figure 11:
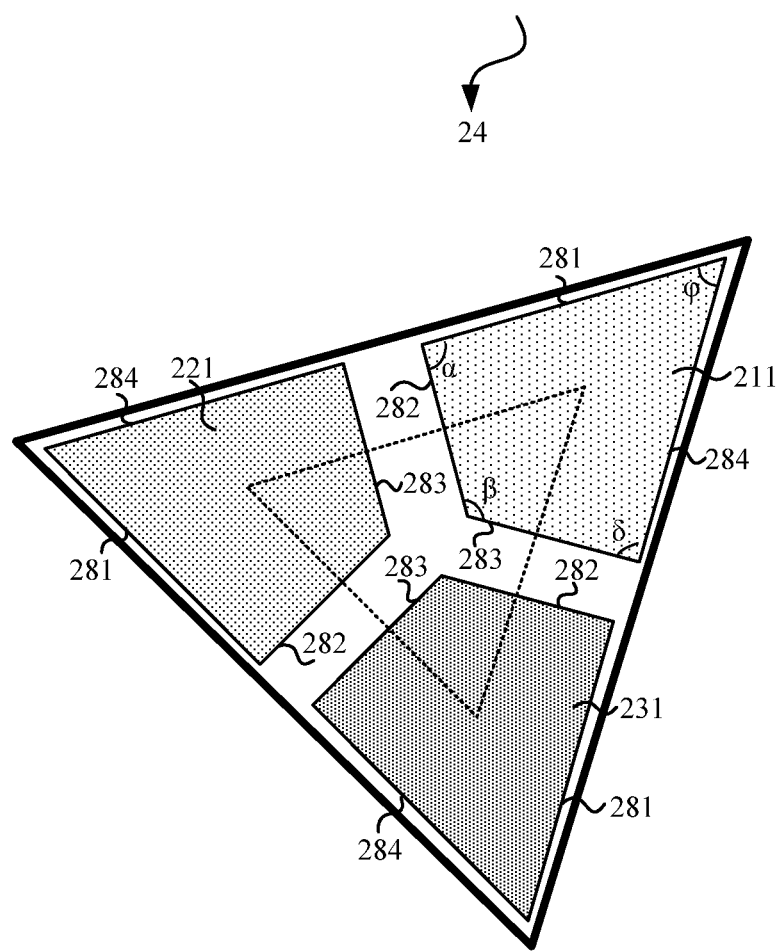
FIG. 11 is a structural diagram of a main pixel in the display panel shown in FIG. 10.

FIG. 10 is a structural diagram of another display panel according to an embodiment of the present disclosure. FIG. 11 is an enlarged view of a main pixel shown in FIG. 10. FIG. 10 and FIG. 11 illustrate the case where the distance L1 between the center point of the main pixel and the corresponding image point in the first direction is 0 by taking the example that the shape of the pixel unit includes a rectangle and the shape of the sub-pixel includes a quadrilateral. As shown in FIG. 10, the first sub-pixel 211, the second sub-pixel 221 and the third sub-pixel 231 each include a second side 281, a third side 282, a fourth side 283 and a fifth side 284 connected end to end in sequence. A length of the second side 281 is equal to a length of the fifth side 284, a length of the third side 282 is equal to a length of the fourth side 283, and the length of the third side 282 is less than the length of the second side 281. The first sub-pixel 211, the second sub-pixel 221 and the third sub-pixel 231 form the main pixel 24 in a manner that short sides are parallel. Every two of center points of three sub-pixels in the same main pixel are connected into lines to form an equilateral triangle. The center point 241 of the main pixel is located at a junction point position of the first pixel unit 21, second pixel unit 22 and third pixel unit 23, which are adjacent to each other.

Exemplarily, the shape of the pixel unit may be adjusted to be a rectangle by adjusting the shape and the size of the pixel defining layer, the shape of the sub-pixel in the pixel unit may be adjusted to be a quadrilateral by adjusting the shape and the size of the anode in the same pixel unit, in the quadrilateral, the length of the second side 281 is equal to the length of the fifth side 284, the length of the third side 282 is equal to the length of the fourth side 283, the length of the third side 282 is less than the length of the second side 281, and meanwhile the center point 241 of the main pixel is adjusted to be at the junction point position of the first pixel unit 21, second pixel unit 22 and third pixel unit 23, which are adjacent to each other, so as to ensure that the distance L1 between the center point of the main pixel and the corresponding image point in the direction in which the two points are connected to form a line is 0, that the center point of the main pixel is completely overlapped with the image point of the display source image, and that the display source image can be accurately displayed by directly using the display panel provided in the embodiment of the present disclosure. The display procedure is simple, and the display response is fast. Meanwhile, the 100% fidelity of the display is ensured, and the display effect is good.

In one embodiment of the present disclosure, still referring to FIG. 11, in each sub-pixel, an angle between the second side 281 and the third side 282 is α, an angle between the third side 282 and the fourth side 283 is β, an angle between the fourth side 283 and the fifth side 284 is δ, and an angle between the fifth side 284 and the second side 281 is φ, where $\alpha=\delta=90°$, $\beta=120°$, and $\varphi=60°$.

Exemplarily, the angle α between the second side 281 and the third side 282 is set to be 90°, the angle β between the third side 282 and the fourth side 283 is set to be 120°, the angle δ between the fourth side 283 and the fifth side 284 is set to be 90°, and the angle φ between the fifth side 284 and the second side 281 is set to be 60°, so as to ensure that the first sub-pixel 211, the second sub-pixel 221 and the third sub-pixel 231 form the main pixel 24 in the shape of an equilateral triangle in a manner that short sides are parallel, and that the main pixel in the display panel is simply configured. Through the simple configuration of the main pixels, the center point 241 of the main pixel is completely overlapped with the image point of the display source image. It is ensured that the configuration manner of the main pixel is easy while the display effect of the display panel is good, and that the preparation process of the display panel is simple.

Figure 12:
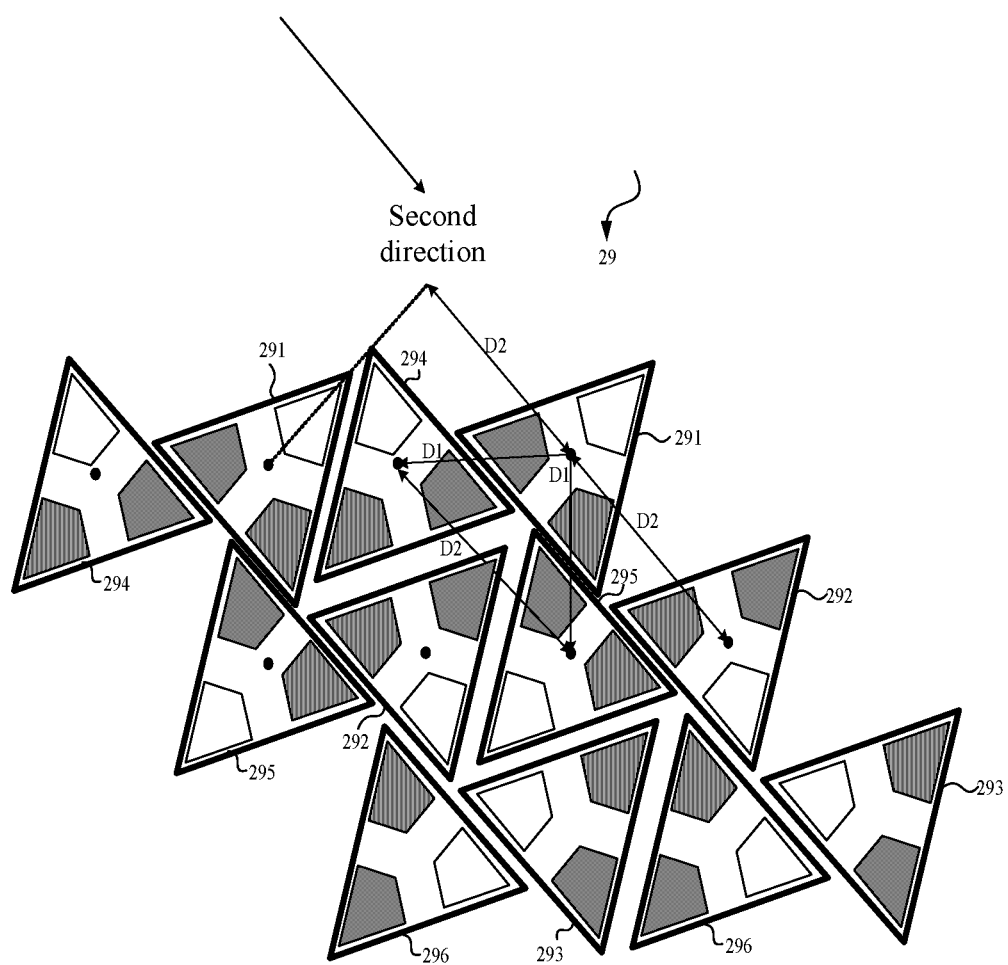
FIG. 12 is a structural diagram of two main pixel repeating units in the display panel shown in FIG. 10.

FIG. 12 is a structural diagram of two main pixel repeating units in the display panel shown in FIG. 10. As shown in FIG. 10 and FIG. 12, the display panel provided in the embodiment of the present disclosure may include a plurality of main pixel repeating units 29. Each main pixel repeating unit 29 includes a first main pixel 291, a second main pixel 292, a third main pixel 293, a fourth main pixel 294, a fifth main pixel 295 and a sixth main pixel 296. The first main pixel 291, the second main pixel 292 and the third main pixel 293 are adjacently disposed in sequence in the second direction. The fourth main pixel 294, the fifth main pixel 295 and the sixth main pixel 296 are adjacently disposed in sequence in the second direction. The second direction is intersected with the first long-axis direction, as shown in the figure.

A first sub-pixel 211, the second main pixel 292 is acquired by rotating a second sub-pixel 221 and a third sub-pixel 231 in the first main pixel 291 by 120° in a clockwise direction, and the third main pixel 293 is acquired by rotating a first sub-pixel 211, a second sub-pixel 221 and a third sub-pixel 231 in the second main pixel 292 by 120° in the clockwise direction. The fifth main pixel 295 is acquired by rotating a first sub-pixel 211, a second sub-pixel 221 and a third sub-pixel 231 in the fourth main pixel 294 by 120° in a counterclockwise direction, and the sixth main pixel acquired by rotating a first sub-pixel 211, a second sub-pixel 221 and a third sub-pixel 231 in the fifth main pixel 295 by 120° in the counterclockwise direction. A distance from a center point 241 of the first main pixel 291 to a center point 241 of the fourth main pixel 294 or a center point 241 of the fifth main pixel 295 is a first distance D1, a distance from a center point 241 of the first main pixel 291 to a center point 241 of the second main pixel 292 is a second distance D2, and $D2=\sqrt{2} \cdot D1$.

Exemplarily, as shown in FIG. 10 and FIG. 12, the second main pixel 292 is acquired by rotating the first main pixel 291 by 120° in the clockwise direction, the third main pixel 293 is acquired by rotating the second main pixel 292 by 120° in the clockwise direction to acquire, the fifth main pixel 295 is acquired by rotating the fourth main pixel 294 by 120° in the counterclockwise direction to acquire, and the sixth main pixel 296 is acquired by rotating the fifth main pixel 295 by 120° in the counterclockwise direction. The rotation corresponding relationship of the main pixels is simple, and the arrangement rule of the main pixels of the entire display panel is simple. Meanwhile, in a same main pixel repeating unit 29, a line connecting the center point 241 of the first main pixel 291 and the center point 241 of the fourth main pixel 294, a line connecting the center point 241 of the first main pixel 291 and the center point 241 of the fifth main pixel 295, and a line connecting the center point 241 of the fourth main pixel 291 and the center point 241 of the fifth main pixel 294 form an isosceles right triangle; or a line connecting the center point 241 of the first main pixel 291 and the center point 241 of the fifth main pixel 295, a line connecting the center point 241 of the second main pixel 292 and the center point 241 of the fifth main pixel 295 and a line connecting the center point 241 of the first main pixel 291 and the center point 241 of the second main pixel 292 form an isosceles right triangle. Therefore, a second distance D2 from the center point 241 of the first main pixel 291 to the center point 241 of the second main pixel 292 and a first distance D1 from the center point 241 of the first main pixel 291 to the center point 241 of the fourth main pixel 294 or the center point 241 of the fifth main pixel 295 satisfy that $D2=\sqrt{2}D1$. Moreover, the lines connecting the center point of the fourth main pixel 294, the center point of the first main pixel 291, the center point of the fifth main pixel 295, the center point of the second main pixel 292, the center point of the sixth main pixel 296 and the center point of the third main pixel 293 in sequence have a broken line type, and the angle between two adjacent connecting lines is a right angle.

Based on the above-mentioned rotational corresponding relationship between the main pixels and the distance relationship between the center points of main pixels, the position relationship between main pixels 24 in the entire main pixel repeating unit 29 may be determined. The position of each main pixel 24 is set according to the above-mentioned position relationship, so as to ensure that the distance L1 between the center point of the main pixel and the corresponding image point in the direction in which the two points are connected to form a line is 0, that the center point of the main pixel is completely overlapped with the image point of the display source image, and that the display source image can be accurately displayed by directly using the display panel provided in the embodiment of the present disclosure. The display procedure is simple, and the display response is fast. Meanwhile, the 100% fidelity of the display is ensured, and the display effect is good.

In one embodiment of the present disclosure, still referring to FIG. 10, along the second direction, main pixel repeating units are sequentially arranged; and along a direction perpendicular to the second direction, two adjacent main pixel repeating units are staggered along the second direction by one main pixel unit, a plurality of main pixel repeating units 29 cover the entire display panel according to the arrangement rule. The main pixel repeating units are arranged in a simple manner, and meanwhile the distance L1 between the center point of the main pixel and the corresponding image point in the direction in which the two points are connected to form a line is 0, the center point of the main pixel is ensured to be completely overlapped with the image point of the display source image. The display procedure is simple, and the display response is fast. Meanwhile, the 100% fidelity of the display is ensured, and the display effect is good.

It is to be noted that as shown in FIG. 12, the two adjacent main pixel repeating units 29 are arranged to be staggered along the second direction by one main pixel unit, which may be understood as that a distance between center points of two corresponding main pixels in two adjacent main pixel repeating units 29 in the second direction is equal to a distance between center points of two adjacent main pixels in the same main pixel repeating unit 29 in the second direction. As shown in FIG. 12, a distance between center points of two first main pixels 291 in two adjacent main pixel repeating units 29 is the same as a distance between the center point of the first main pixel 291 and the center point of the second main pixel 292 in the same main pixel repeating unit 29, and is D2.

In summary, a position and a shape of the pixel defining layer between different pixel units and a position and a shape of the anode in the same pixel unit are adjusted, so as to ensure that the distance L1 between the center point of the main pixel and the corresponding image point in the direction in which the two points are connected to form a line is 0, and thus it can be ensured that the center point of the main pixel is completely overlapped with the image point of the display source image, and that the display source image can be accurately displayed by directly using the display panel provided in the embodiment of the present disclosure. The display procedure is simple, and the display response is fast. Meanwhile, the image point of the display source image does not need to be deformed, the 100% fidelity of the display is ensured, and the display effect is good.

Next, description is about that the distance L1 between the center point of the main pixel and the corresponding image point in the first direction is not 0, but the distance L1 between the center point of the main pixel and the corresponding image point in the first direction and the distance L2 between display positions of two adjacent image points satisfy that L1/L2≤10%.

Still referring to FIG. 4, the shapes of the first pixel unit 21, the second pixel unit 22 and the third pixel unit 23 respectively include a rectangle; the shapes of the first sub-pixel 211, the second sub-pixel 221 and the third sub-pixel 231 respectively include a rectangle; and the center point 241 of the main pixel is staggered from a junction point of the adjacent first pixel unit 21, second pixel unit 22 and third pixel unit 23.

Exemplarily, comparison between FIG. 3 and FIG. 4 is made, and FIG. 4 differs from FIG. 3 in that the light-emitting area of the sub-pixel in FIG. 4 is larger than the light-emitting area of the sub-pixel in FIG. 3, ensuring that a larger aperture ratio of the display panel is achieved. In fact, the display panel shown in FIG. 4 achieves a larger display aperture ratio at the cost that the center point of the main pixel deviates from the image point of the display source image by a certain distance, but the distance L1 between the center point of the main pixel and the corresponding image point in the first direction and the distance L2 between display positions of two adjacent image points still satisfy that L1/L2≤10%. When the display panel shown in FIG. 4 is used to display the display source image, the display panel shown in FIG. 4 may also be used to directly display the display source image without calculating or then deforming the image points of the display source image, so that it is ensured that the display procedure is simple, the display response is fast, the display fidelity is high and the display effect is good.

It is to be noted that although FIG. 4 makes a description by taking one pixel unit being directly divided into six sub-pixels as an example, it may be understood that in one pixel unit shown in FIG. 4, the light-emitting region of the sub-pixel is defined by the anode. The display panel shown in FIG. 4 differs from the display panel shown in FIG. 3 in that the gap between two adjacent anodes in FIG. 4 is small, e.g., the minimum size that can be achieved in the related art, and the display panel is ensured to have a large aperture ratio.

In the actual use procedure, different display panels may be specifically selected for display according to specific requirements. For example, if the requirement for display guarantee is strict and the 100% fidelity is required, the display panel shown in FIG. 3 or FIG. 9 may be selected for display; and if the display fidelity is required to be high and the display panel is required to have a large display aperture ratio, the display panel shown in FIG. 4 may be selected for display.

Still referring to FIG. 3, FIG. 4, FIG. 5, FIG. 8 and FIG. 9, regardless of whether the distance L1 between the center point of the main pixel and the corresponding image point in the first direction is 0, or the distance L1 (see FIG. 5) between the center point of the main pixel and the corresponding image point in the first direction and the distance L2 (See FIG. 5) between the display positions of two adjacent image points satisfy that L1/L2≤10%, in each main pixel 24, the distance between the center point 241 (see FIG. 8) of the main pixel and the first sub-pixel center point of the first sub-pixel 211, the distance between the center point 241 of the main pixel and the second sub-pixel center point of the second sub-pixel 221, and the distance between the center point 241 of the main pixel and the third sub-pixel center point of the third sub-pixel 231 are the same, that is, the center point of the sub-pixel is located on a track with the center at the center point of the main pixel and of radius R (see FIG. 8). R is the distance between the center point of the main pixel and the center point of the sub-pixel.

Figure 13:
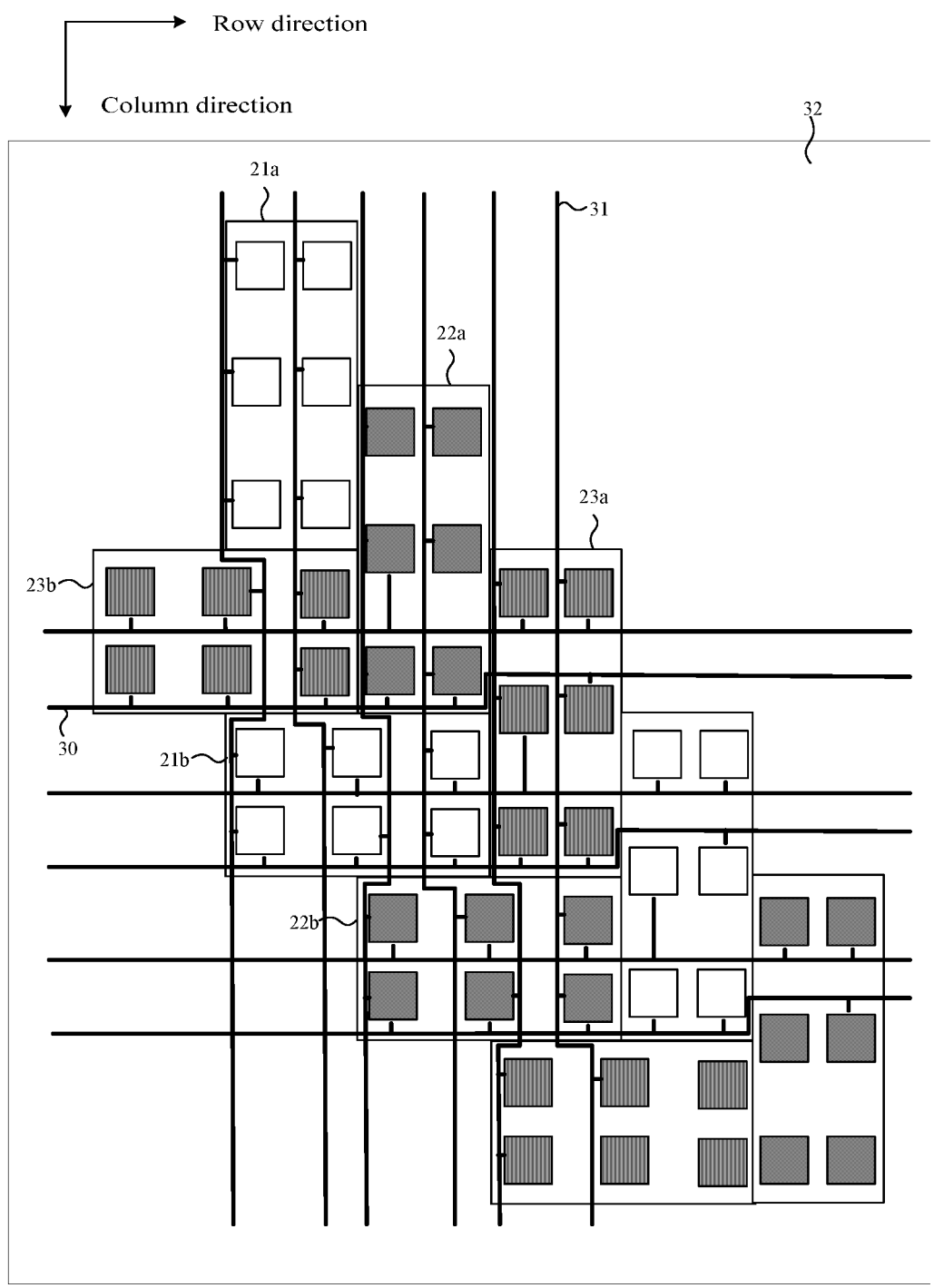
FIG. 13 is a structural diagram of another display panel according to an embodiment of the present disclosure.

In one embodiment of the present disclosure, FIG. 13 is a structural diagram of another display panel according to an embodiment of the present disclosure, and FIG. 13 shows configuration of data lines and scanning lines in the display panel according to the embodiment of the present disclosure. As shown in FIG. 13, the display panel further includes a plurality of scanning lines 30 and a plurality of data lines 31. The first A-type pixel unit 21a, the second A-type pixel unit 22a and the third A-type pixel unit each include a first column of sub-pixels and a second column of sub-pixels which are arranged along the second long-axis direction, and a first row of sub-pixels, a second row of sub-pixels and a third row of sub-pixels which are arranged along the first long-axis direction; the first B-type pixel unit 21b, the second B-type pixel unit and the third B-type pixel unit each include a third column of sub-pixels, a fourth column of sub-pixels and a fifth column of sub-pixels which are arranged along the second long-axis direction, and a fourth row of sub-pixels and a fifth row of sub-pixels which are arranged along the first long-axis direction. A row direction is parallel to the second long-axis direction, and a column direction is parallel to the first long-axis direction. The first A-type pixel unit 21a, the second A-type pixel unit 22a and the third A-type pixel unit 23a each correspond to four scanning lines and two data lines; and the first B second pixel unit 21b, the second B-type pixel unit 22b and the third B-type pixel unit 23b each correspond to two scanning lines 30 and four data lines 31. The first column of sub-pixels in the first A-type pixel unit 21a, one sub-pixel of the fourth column of sub-pixels in the third B-type pixel unit 23b, and the third column of sub-pixels in the first B-type pixel unit are connected to a same data line 31. The second column of sub-pixels in the first A-type pixel unit 21a, the fifth column of sub-pixels in the third B-type pixel unit 23b and one sub-pixel of the fourth column of sub-pixels in the first B-type pixel unit 21b are connected to a same data line 31. The first column of sub-pixels in the second A-type pixel unit 22a, one sub-pixel of the fourth column of sub-pixels in the first B-type pixel unit 21b, and the third column of sub-pixels in the second B-type pixel unit are connected to a same data line 31. The second column of sub-pixels in the second A-type pixel unit 22a, the fifth column of sub-pixels in the first B-type pixel unit 21b and one sub-pixel of the fourth column of sub-pixels in the second B-type pixel unit are connected to a same data line. The first column of sub-pixels in the third A-type pixel unit 23a, one sub-pixel of the fourth column of sub-pixels in the second B-type pixel unit 22b, and the third column of sub-pixels in the third B-type pixel unit 23b are connected to a same data line 31. The second column of sub-pixels in the third A-type pixel unit 23a, the fifth column of sub-pixels in the second B-type pixel unit 22b and one sub-pixel of the fourth column of sub-pixels in the third B-type pixel unit 23b are connected to a same data line 31. The fourth row of sub-pixels in the first B-type pixel unit 21b, one sub-pixel of the second row of sub-pixels in the third A-type pixel unit 23a, and the first row of sub-pixels in the first A-type pixel unit 21a are connected to a same scanning line 30. The fifth row of sub-pixels in the first B-type pixel unit 21b, the third row of sub-pixels in the third A-type pixel unit 23a and one sub-pixel of the second row of sub-pixels in the first A-type pixel unit 21a are connected to a same scanning line 30. The fourth row of sub-pixels in the second B-type pixel unit 22b, one sub-pixel of the second row of sub-pixels in the first A-type pixel unit 21a, and the first row of sub-pixels in the second A-type pixel unit 22a are connected to a same scanning line 30. The fifth row of sub-pixels in the second B-type pixel unit 22b, the third row of sub-pixels in the first A-type pixel unit 21a and one sub-pixel of the second row of sub-pixels in the second A-type pixel unit 22a are connected to a same scanning line 30. The fourth row of sub-pixels in the third B-type pixel unit 23b, one sub-pixel of the second row of sub-pixels in the second A-type pixel unit 22a, and the first row of sub-pixels in the third A-type pixel unit 23a are connected to a same scanning line 30. The fifth row of sub-pixels in the third B-type pixel unit 23b, the third row of sub-pixels in the second A-type pixel unit 22a and one sub-pixel of the second row of sub-pixels in the third A-type pixel unit 23a are connected to a same scanning line 30.

Exemplarily, for one repeating unit formed by the first A-type pixel unit 21a, the first B-type pixel unit 21b, the second A-type pixel unit 22a, the second B-type pixel unit 22b, the third A-type pixel unit 23a and the third B-type pixel unit 23b, one scanning line 30 simultaneously connects six sub-pixels in the same repeating unit, for example, one scanning line 30 is simultaneously connected to the fourth row of sub-pixels (three) in the first B-type pixel unit 21b, one sub-pixel (one) of the second row of sub-pixels in the third A-type pixel unit 23a and the first row of sub-pixels (two) in the first A-type pixel unit 21; and meanwhile one data line 31 is simultaneously connected to six sub-pixels in the same repeating unit, for example, one data line 31 is simultaneously connected to the first column of sub-pixels (three) in the first A-type pixel unit 21a, one (one) of the fourth column of sub-pixels in the third B-type pixel unit 23b, and the third column of sub-pixels (two) in the first B-type pixel unit 21b, so as to ensure that the numbers of sub-pixels connected to each scanning line 30 and each data line 31 are the same, that the loads on each scanning line 30 and each data line 31 are the same, that the display signals transmitted to each sub-pixel through the scanning lines 30 and the data lines 31 are uniform, and that the display uniformity of the display panel is good.

It is to be noted that the display panel provided in the embodiment of the present disclosure may further include a driving circuit, such as a thin film transistor (not shown in the figure), and actually display signals are transmitted to the each sub-pixel through the scanning lines 30 and the data lines 31 being connected to the driving circuit. FIG. 13 merely and exemplarily show the corresponding relationship between the scanning line 30 and sub-pixels and the corresponding relationship between the data line 31 and sub-pixels, and is not intended to limit the embodiment of the present disclosure.

In one embodiment of the present disclosure, still referring to FIG. 13, the display panel provided in the embodiment of the present disclosure may further include a base substrate 32. Vertical projections of the plurality of scanning lines 30 on the base substrate 32 and vertical projections of the plurality of data lines 31 on the base substrate 32 are not overlapped with vertical projections of the sub-pixels on the base substrate 32, so as to reduce coupling effects between the scanning lines 30 and elements in the sub-pixels and between the data lines 31 and the elements in the sub-pixels, for example, coupling effects between the scanning lines 30 and anodes in the sub-pixels and between the data lines 31 and the anodes in the sub-pixels, and reduce interference of the coupling effects on scanning signals in the scanning lines 30 and data signals in the data lines 31. Thus, the display effect of the display panel is ensured.

Figure 14:
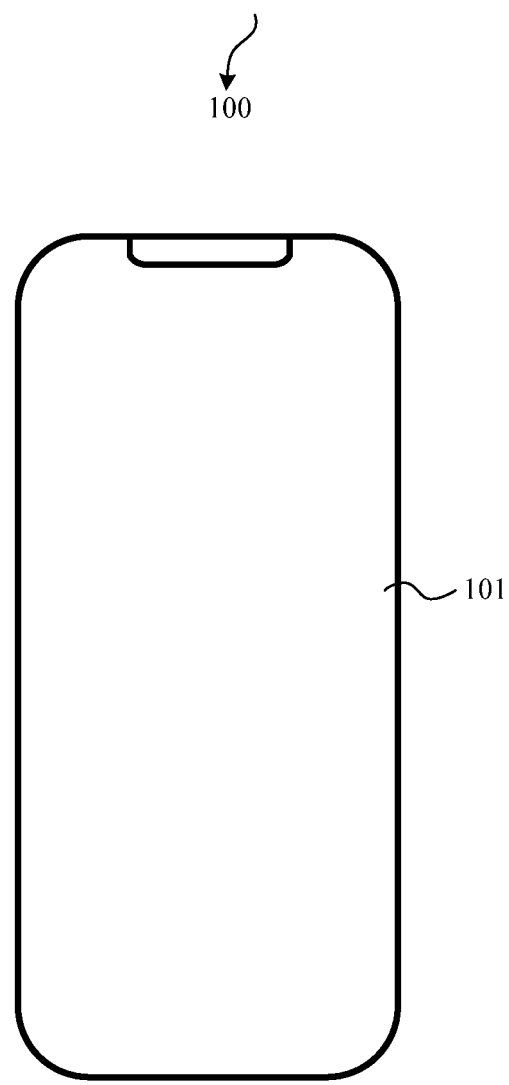
FIG. 14 is a schematic diagram of a display device according to an embodiment of the present disclosure.

Based on the same inventive concept, an embodiment of the present disclosure further provides a display device. FIG. 14 is a schematic diagram of a display device according to the embodiment of the present disclosure. A display device 100 provided in the embodiment of the present disclosure includes the display panel 101 described in any embodiment of the present disclosure. In one embodiment of the present disclosure, the display device provided in the embodiment of the present disclosure may be a mobile phone shown in FIG. 14, or may be a computer, a television, an smart wearable display device, or the like, which is not specifically limited in the embodiment of the present disclosure.

It is to be noted that the above are merely preferred embodiments of the present disclosure and the technical principles used therein. It will be understood by those skilled in the art that the present disclosure is not limited to the specific embodiments described herein, and that the features of the various embodiments of the present disclosure may be coupled or combined in part or in whole with one another, and may be collaborated with one another and technically driven in various ways. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
    first pixel units, second pixel units and third pixel units, disposed close to each other, representing a first color, a second color, and a third color respectively, wherein the first pixel units, each comprises six first sub-pixels dividing an anode on said first pixel unit;
    wherein the second pixel units, each comprises six second sub-pixels dividing an anode on said second pixel unit;
    wherein the third pixel units, each comprises six third sub-pixels dividing an anode on said third pixel unit;
    wherein all sub-pixels are insulated from each other;
    wherein a main pixel comprises one of the first, one of the second, and one of the third sub-pixels; and
    a display source image comprising a plurality of image points, arranged in a rectangular grid, wherein four of the plurality of image points form a smallest square in the grid;
    wherein one of the plurality of image points is in one-to-one association with a center point of the main pixel, and said image point falls within 10% proximity of the associated center point of the main pixel, wherein the proximity is defined as:
    L1/L2≤10%,
    wherein L1 is a distance between said image point and the center of the main pixel, and L2 is a distance between display positions of two closest image points.

2. The display panel of claim 1, wherein a repeating unit comprises two first pixel units, two second pixel units and two third pixel units, wherein the two first pixel units comprise a first A-type pixel unit and a first B-type pixel unit which are perpendicular to each other in a, long-axis direction, the two second pixel units comprise a second A-type pixel unit and a second B-type pixel unit which are perpendicular to each other in the long-axis direction, and the two third pixel units comprise a third A-type pixel unit and a third B-type pixel unit which are perpendicular to each other in the long-axis direction;
   wherein the long-axis direction of the first A-type pixel unit, the second A-type pixel unit and the third A-type pixel unit are the same and are a first long-axis direction, wherein the long-axis direction of the first B-type pixel unit, the second B-type pixel unit and the third B-type pixel unit are the same and are a second long-axis direction; the first A-type pixel unit, the second A-type pixel unit and the third A-type pixel unit are adjacently disposed in sequence along the second long-axis direction, and are staggered in sequence by a preset distance along the first long-axis direction; the first second B-type pixel unit, the second B-type pixel unit and the third B-type pixel unit are adjacently disposed in sequence along the first long-axis direction, and are staggered in sequence by the preset distance along the second long-axis direction; and
   wherein the first A-type pixel unit is disposed adjacent to the second B-type pixel unit and the third B-type pixel unit which are located in a same repeating unit as the first A-type pixel unit, the second A-type pixel unit is disposed adjacent to the first B-type pixel unit and third B-type pixel unit which are located in a same repeating unit as the second A-type pixel unit, and the third A-type pixel unit is disposed adjacent to the first B-type pixel unit located in a same repeating unit as the third A-type pixel unit and the second B-type pixel unit located in an adjacent repeating unit.

3. The display panel of claim 2, wherein the first A-type pixel unit, the second A-type pixel unit and the third A-type pixel unit, each have a maximum length L3 in the first long-axis direction and a maximum length L4 in the second long-axis direction; and wherein the first B-type pixel unit, the second B-type pixel unit and the third B-type pixel unit, each have a maximum length L4 in the first long-axis direction and a maximum length L3 in the second long-axis direction, wherein L3=2·L4; and
   wherein a length of the preset distance is L4.

4. The display panel of claim 3, wherein the distance L1 between the center point of the main pixel and the associated image point is zero.

5. The display panel of claim 4, wherein shapes of each of the first pixel units, each of the second pixel units and each of the third pixel units respectively comprise a rectangle;
   wherein the shapes of each of the first sub-pixels, each of the second sub-pixels, and each of the third sub-pixels comprise a rectangle; and
   wherein the center point of the main pixel is located at a junction point position of one of the first pixel units, one of the second pixel units and one of the third pixel units, which are adjacent to each other.

6. The display panel of claim 5, wherein every two of center points of three sub-pixels in a same main pixel are connected into lines to form an isosceles triangle; the isosceles triangle comprises a first side whose extension direction is parallel to the first long-axis direction or the second long-axis direction, and a direction in which the center point of the main pixel to a midpoint of the first side is a setting direction; and
   wherein along the first long-axis direction or the second long-axis direction, a main pixel group comprises four main pixels, which are adjacent to each other, wherein the main pixel group comprises a first main pixel subgroup and a second main pixel subgroup, setting directions corresponding to two main pixels in the first main pixel subgroup are opposite, setting directions corresponding to two main pixels in the second main pixel subgroup are opposite, and a setting direction corresponding to either of the two main pixels in the first main pixel subgroup is perpendicular to a setting direction corresponding to either of the two main pixels in the second main pixel subgroup.

7. The display panel of claim 6, wherein each of the first sub-pixels, each of the second sub-pixels and each of the third sub-pixels have a same area.

8. The display panel of claim 4, wherein each of the six first sub-pixels, each of the six second sub-pixels and each of the six third sub-pixels comprises a second side, a third side, a fourth side and a fifth side connected end to end in sequence, wherein a length of the second side is equal to a length of the fifth side, a length of the third side is equal to a length of the fourth side, and the length of the third side is less than the length of the second side;
   each of the six first sub-pixels, each of the six second sub-pixels and each of the six third sub-pixels form the main pixel in a manner that short sides are parallel; wherein every two of center points of three sub-pixels in a same main pixel are connected into lines to form an equilateral triangle; and wherein the center point of the main pixel is located at a junction point position of the first pixel units, the second pixel units and the third pixel units, which are adjacent to each other.

9. The display panel of claim 8, wherein each of the sub-pixels, an angle between the second side and the third side is α, an angle between the third side and the fourth side is β, an angle between the fourth side and the fifth side is δ, and an angle between the fifth side and the second side is φ, wherein α=δ=90°, β=120°, and φ=60°.

10. The display panel of claim 9, wherein the main pixel comprises a first main pixel, a second main pixel, a third main pixel, a fourth main pixel, a fifth main pixel and a sixth main pixel; wherein the first main pixel, the second main pixel and the third main pixel are adjacently disposed in sequence in a second direction, wherein the fourth main pixel, the fifth main pixel and the sixth main pixel are adjacently disposed in sequence in the second direction, and the second direction is intersected with the first long-axis direction;
   wherein the second main pixel is acquired by rotating a first sub-pixel, a second sub-pixel and a third sub-pixel in the first main pixel by 120° in a clockwise direction, and the third main pixel is acquired by rotating a first sub-pixel, a second sub-pixel and a third sub-pixel in the second main pixel by 120° in the clockwise direction;
   wherein the fifth main pixel is acquired by rotating a first sub-pixel, a second sub-pixel and a third sub-pixel in the fourth main pixel by 120° in a counterclockwise direction, and the sixth main pixel is acquired by rotating a first sub-pixel, a second sub-pixel and a third sub-pixel in the fifth main pixel by 120° in the counterclockwise direction; and
   wherein a distance from a center point of the first main pixel to a center point of the fourth main pixel or a center point of the fifth main pixel is a first distance D1, a distance from a center point of the first main pixel to a center point of the second main pixel is a second distance D2, and D2=$\sqrt{2}$·D1.

11. The display panel of claim 10, wherein the center point of the fourth main pixel, the center point of the first main pixel, the center point of the fifth main pixel, the center point of the second main pixel, a center point of the sixth main pixel, and a center point of the third main pixel are connected in sequence to form lines having a broken line type.

12. The display panel of claim 10, wherein main pixel repeating units comprises the first main pixel, the second main pixel, the third main pixel, the fourth main pixel, the fifth main pixel and the sixth main pixel; wherein the main pixel repeating units are sequentially arranged along the second direction; and
    wherein along a direction perpendicular to the second direction, adjacent two of the main pixel repeating units are staggered along the second direction by one main pixel unit.

13. The display panel of claim 3, wherein shapes of the first pixel units, the second pixel units and the third pixel units comprise a rectangle;
    wherein shapes of each of the six first sub-pixels, each of the six second sub-pixels, and each of the six third sub-pixels respectively comprise a rectangle; and
    wherein the center point of the main pixel is not overlapped with a junction point of the first pixel units, the second pixel units and the third pixel units, which are adjacent to each other.

14. The display panel of claim 2, the display panel comprises a plurality of scanning lines and a plurality of data lines;
    wherein the first A-type pixel unit, the second A-type pixel unit and the third A-type pixel unit, each comprises a first column of sub-pixels and a second column of sub-pixels which are arranged along the second long-axis direction, and a first row of sub-pixels, a second row of sub-pixels and a third row of sub-pixels which are arranged along the first long-axis direction; wherein the first B-type pixel unit, the second B-type pixel unit and the third B-type pixel unit, each comprises a third column of sub-pixels, a fourth column of sub-pixels and a fifth column of sub-pixels which are arranged along the second long-axis direction, and a fourth row of sub-pixels and a fifth row of sub-pixels which are arranged along the first long-axis direction, wherein a row direction is parallel to the second long-axis direction, and a column direction is parallel to the first long-axis direction;
    wherein the first A-type pixel unit, the second A-type pixel unit and the third A-type pixel unit each correspond to four scanning lines and two data lines; wherein the first second B-type pixel unit, the second B-type pixel unit and the third B-type pixel unit, each corresponds to two scanning lines and four data lines;
    wherein the first column of sub-pixels in the first A-type pixel unit, one sub-pixel of the fourth column of sub-pixels in the third B-type pixel unit, and the third column of sub-pixels in the first B-type pixel unit are connected to a same data line; wherein the second column of sub-pixels in the first A-type pixel unit, the fifth column of sub-pixels in the third B-type pixel unit, and one sub-pixel of the fourth column of sub-pixels in the first B-type pixel unit are connected to a same data line;
    wherein the first column of sub-pixels in the second A-type pixel unit, one sub-pixel of the fourth column of sub-pixels in the first B-type pixel unit, and the third column of sub-pixels in the second B-type pixel unit are connected to a same data line; wherein the second column of sub-pixels in the second A-type pixel unit, the fifth column of sub-pixels in the first B-type pixel unit, and one sub-pixel of the fourth column of sub-pixels in the second B-type pixel unit are connected to a same data line;
    wherein the first column of sub-pixels in the third A-type pixel unit, one sub-pixel of the fourth column of sub-pixels in the second B-type pixel unit, and the third column of sub-pixels in the third B-type pixel unit are connected to a same data line; wherein the second column of sub-pixels in the third A-type pixel unit, the fifth column of sub-pixels in the second B-type pixel unit, and one sub-pixel of the fourth column of sub-pixels in the third B-type pixel unit are connected to a same data line;
    wherein the fourth row of sub-pixels in the first B-type pixel unit, one sub-pixel of the second row of sub-pixels in the third A-type pixel unit, and the first row of sub-pixels in the first A-type pixel unit are connected to a same scanning line; wherein the fifth row of sub-pixels in the first B-type pixel unit, the third row of sub-pixels in the third A-type pixel unit, and one sub-pixel of the second row of sub-pixels in the first A-type pixel unit are connected to a same scanning line;
    wherein the fourth row of sub-pixels in the second B-type pixel unit, one sub-pixel of the second row of sub-pixels in the first A-type pixel unit, and the first row of sub-pixels in the second A-type pixel unit are connected to a same scanning line; wherein the fifth row of sub-pixels in the second B-type pixel unit, the third row of sub-pixels in the first A-type pixel unit, and one sub-pixel of the second row of sub-pixels in the second A-type pixel unit are connected to a same scanning line; and
    wherein the fourth row of sub-pixels in the third B-type pixel unit, one sub-pixel of the second row of sub-pixels in the second A-type pixel unit, and the first row of sub-pixels in the third A-type pixel unit are connected to a same scanning line; wherein the fifth row of sub-pixels in the third B-type pixel unit, the third row of sub-pixels in the second A-type pixel unit, and one sub-pixel of the second row of sub-pixels in the third A-type pixel unit are connected to a same scanning line.

15. The display panel of claim 14, comprising a base substrate; and
    along a direction perpendicular to the base substrate, the plurality of scanning lines and the plurality of data lines are not overlapped with the sub-pixels.

16. The display panel of claim 1, wherein in the main pixel, a distance between the center point of the main pixel and a first sub-pixel center point of the six first sub-pixels, a distance between the center point of the main pixel and a second sub-pixel center point of the six second sub-pixels, and a distance between the center point of the main pixel and a third sub-pixel center point of the six second sub-pixels are the same.

17. A display device, comprising a display panel, wherein the display panel comprises:
    first pixel units, second pixel units and third pixel units, disposed close to each other, representing a first color, a second color, and a third color respectively, wherein the first pixel units, each comprises six first sub-pixels dividing an anode on said first pixel unit;
    wherein the second pixel units each comprises six second sub-pixels dividing an anode on said second pixel unit;
    wherein the third pixel units, each comprises six third sub-pixels dividing an anode on said third pixel unit;

wherein all sub-pixels are insulated from each other;
wherein a main pixel comprises one of the first, one of the second, and one of the third sub-pixels; and
a display source image comprising a plurality of image points, arranged in a rectangular grid, wherein four of the plurality of image points form a smallest square in the grid;
wherein one of the plurality of image points is in one-to-one association with a center point of the main pixel, and said image point falls within 10% proximity of the associated center point of the main pixel, wherein the proximity is defined as:

L1/L2≤10%, wherein L1 is a distance between said image point and the center of the main pixel, and L2 is a distance between display positions of two closest image points.

* * * * *